(12) United States Patent
Ching et al.

(10) Patent No.: US 9,966,471 B2
(45) Date of Patent: May 8, 2018

(54) STACKED GATE-ALL-AROUND FINFET AND METHOD FORMING THE SAME

(71) Applicant: Taiwan Semiconductor Manufacturing Company, Ltd., Hsin-Chu (TW)

(72) Inventors: Kuo-Cheng Ching, Zhubei (TW); Chi-Wen Liu, Hsin-Chu (TW); Ying-Keung Leung, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 14/675,160

(22) Filed: Mar. 31, 2015

(65) Prior Publication Data
US 2016/0240681 A1 Aug. 18, 2016

Related U.S. Application Data

(60) Provisional application No. 62/115,558, filed on Feb. 12, 2015.

(51) Int. Cl.
*H01L 29/06* (2006.01)
*H01L 29/66* (2006.01)
(Continued)

(52) U.S. Cl.
CPC .... *H01L 29/7856* (2013.01); *H01L 29/66545* (2013.01); *H01L 29/66795* (2013.01); *H01L 29/165* (2013.01); *H01L 2029/7858* (2013.01)

(58) Field of Classification Search
CPC ............. H01L 29/785; H01L 29/42392; H01L 29/41791; H01L 21/283; H01L 21/32;
(Continued)

(56) References Cited

U.S. PATENT DOCUMENTS 7,588,977 B2  9/2009  Suk et al.
7,667,271 B2  2/2010  Yu et al.
(Continued)

FOREIGN PATENT DOCUMENTS

KR    100618900 B1    8/2006
KR    20110065326 A    6/2011
(Continued)

OTHER PUBLICATIONS

Fazzini, et al., "Modeling stress retarded self-limiting oxidation of suspended silicon nanorwires for the development of silicon nanowire-based nanodevices," AIP Journal of Applied Physics, 110, 033524, Feb. 2011, pp. 9.

*Primary Examiner* — Marcos D Pizarro
*Assistant Examiner* — Nelson Garces
(74) *Attorney, Agent, or Firm* — Slater Matsil, LLP

(57) ABSTRACT

A device includes a first semiconductor strip, a first gate dielectric encircling the first semiconductor strip, a second semiconductor strip overlapping the first semiconductor strip, and a second gate dielectric encircling the second semiconductor strip. The first gate dielectric contacts the first gate dielectric. A gate electrode has a portion over the second semiconductor strip, and additional portions on opposite sides of the first and the second semiconductor strips and the first and the second gate dielectrics.

20 Claims, 37 Drawing Sheets

(51) Int. Cl.
  *H01L 29/78*    (2006.01)
  *H01L 27/12*    (2006.01)
  *H01L 21/02*    (2006.01)
  *H01L 29/165*   (2006.01)
  *H01L 21/8244*  (2006.01)
  *H01L 21/336*   (2006.01)
  *H01L 21/8234*  (2006.01)
  *H01L 29/10*    (2006.01)
  *H01L 27/092*   (2006.01)
  *H01L 21/265*   (2006.01)

(58) Field of Classification Search
  CPC .............. H01L 21/3065; H01L 29/665; H01L 29/7856; H01L 21/26533; H01L 29/66795; H01L 21/02532; H01L 21/02236; H01L 29/0649; H01L 2029/7858; H01L 21/02603; H01L 21/30604; H01L 29/0673; H01L 29/42364; H01L 29/66439; H01L 29/775; H01L 29/78696; B82Y 10/00; B82Y 40/00
  USPC .................................... 257/396–406
  See application file for complete search history.

(56) References Cited

U.S. PATENT DOCUMENTS

| | | |
|---|---|---|
| 7,910,453 B2 | 3/2011 | Xu et al. |
| 8,373,238 B2 | 2/2013 | Lee et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,759,184 B2 | 6/2014 | Ho et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,889,497 B2 | 11/2014 | Chen et al. |
| 2007/0181947 A1 | 8/2007 | Chan et al. |
| 2009/0085119 A1* | 4/2009 | Ernst ............... H01L 29/66795 257/365 |
| 2012/0138886 A1 | 6/2012 | Kuhn et al. |
| 2012/0171832 A1* | 7/2012 | Toh .................. H01L 29/66795 438/300 |
| 2012/0193751 A1* | 8/2012 | Kawasaki ............ H01L 29/785 257/506 |
| 2014/0001574 A1 | 1/2014 | Chen et al. |
| 2014/0110755 A1 | 4/2014 | Colinge |
| 2014/0151812 A1 | 6/2014 | Liaw |
| 2015/0194489 A1* | 7/2015 | Barraud ............. H01L 29/0673 257/9 |

FOREIGN PATENT DOCUMENTS

| | | |
|---|---|---|
| KR | 20130081627 A | 7/2013 |
| TW | 201427021 A | 7/2014 |

* cited by examiner

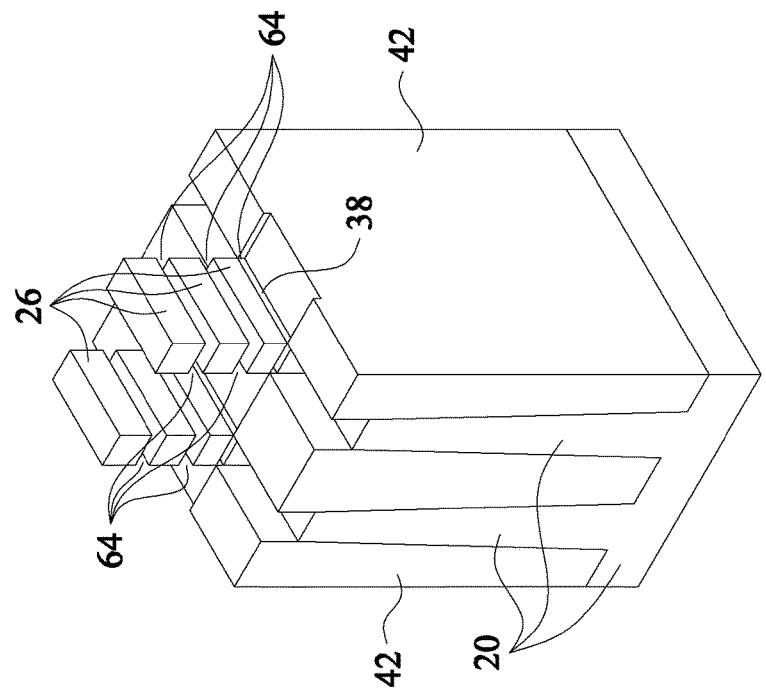
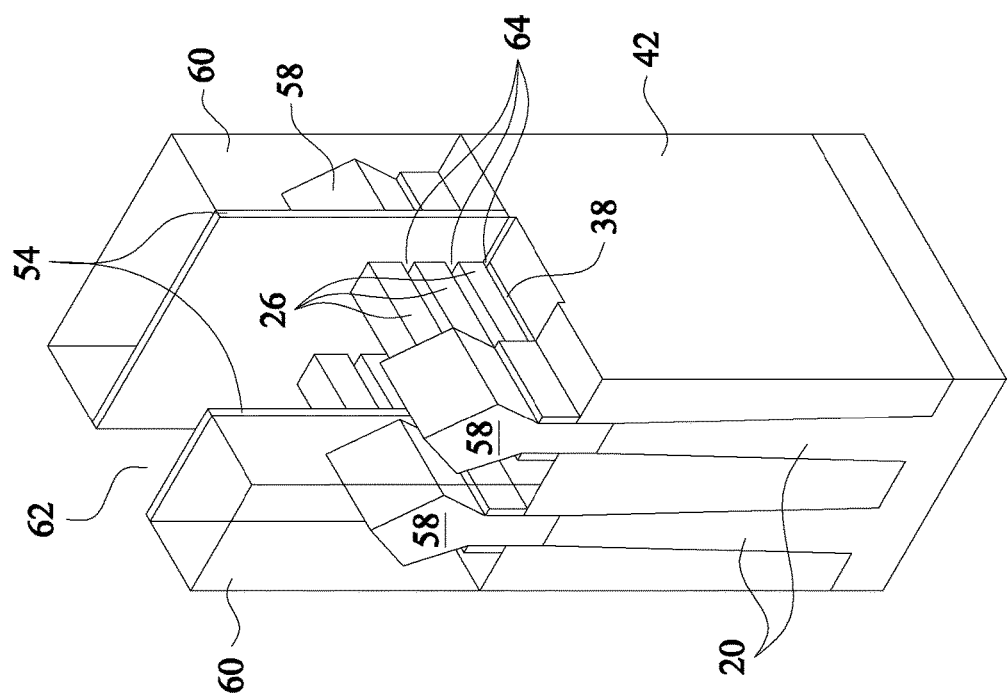
FIG. 12A
FIG. 12B

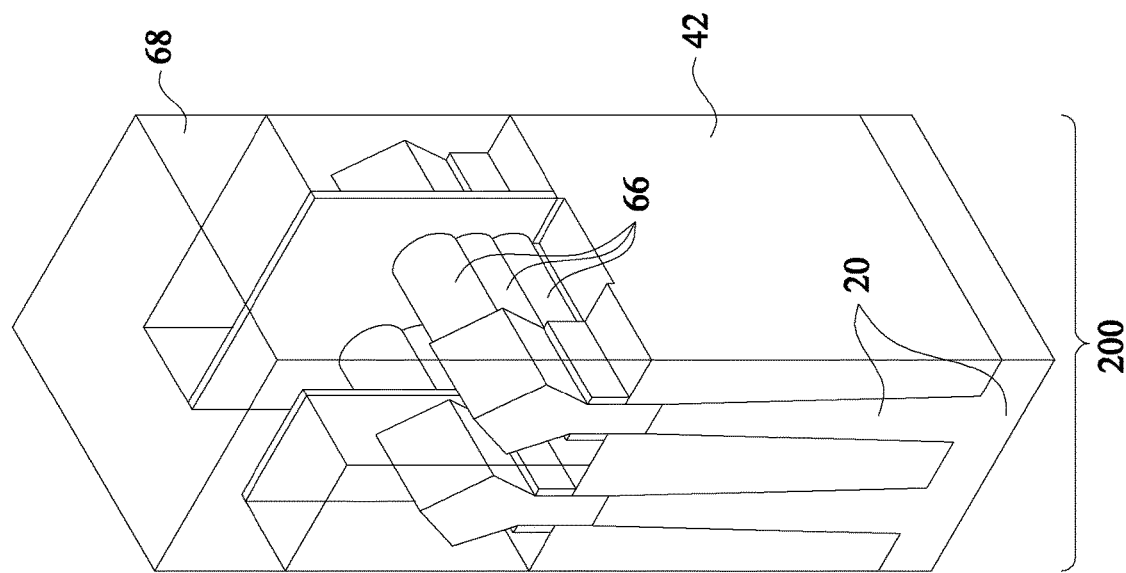
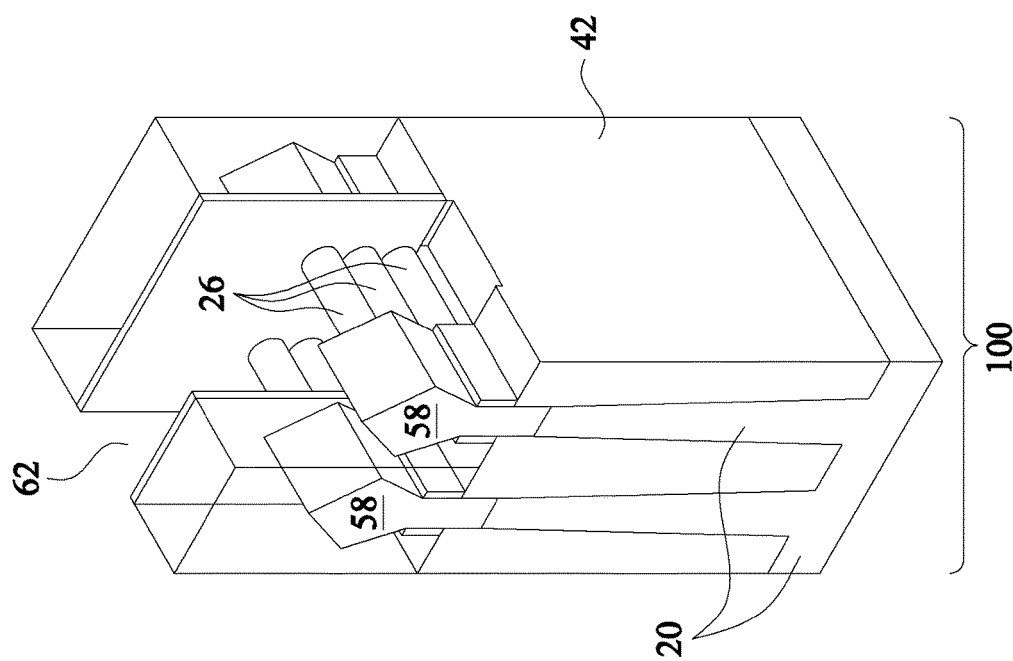
FIG. 14A

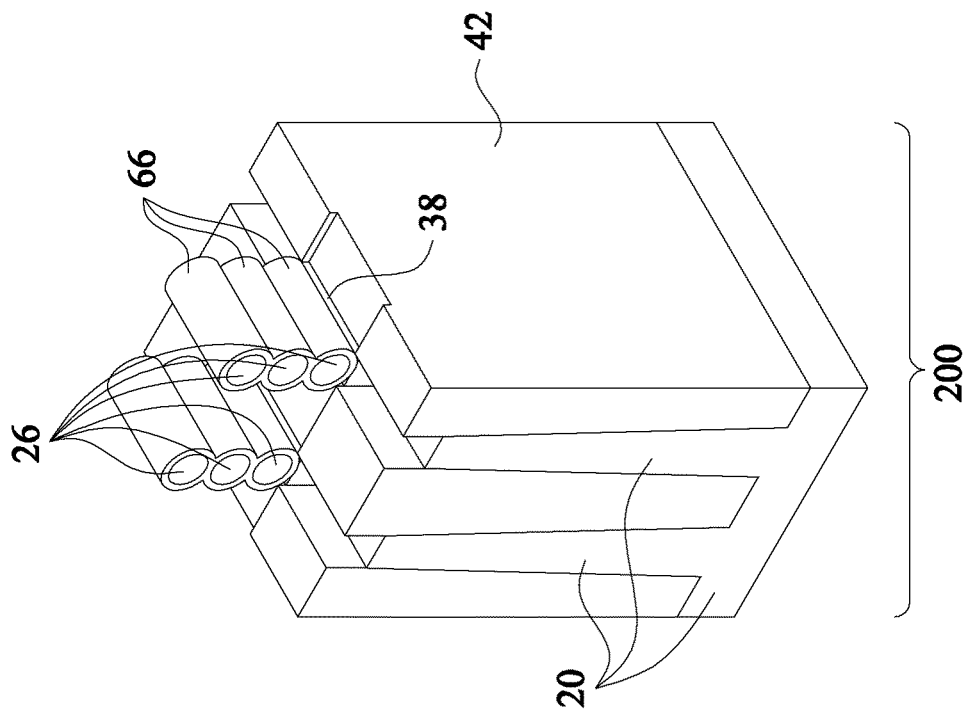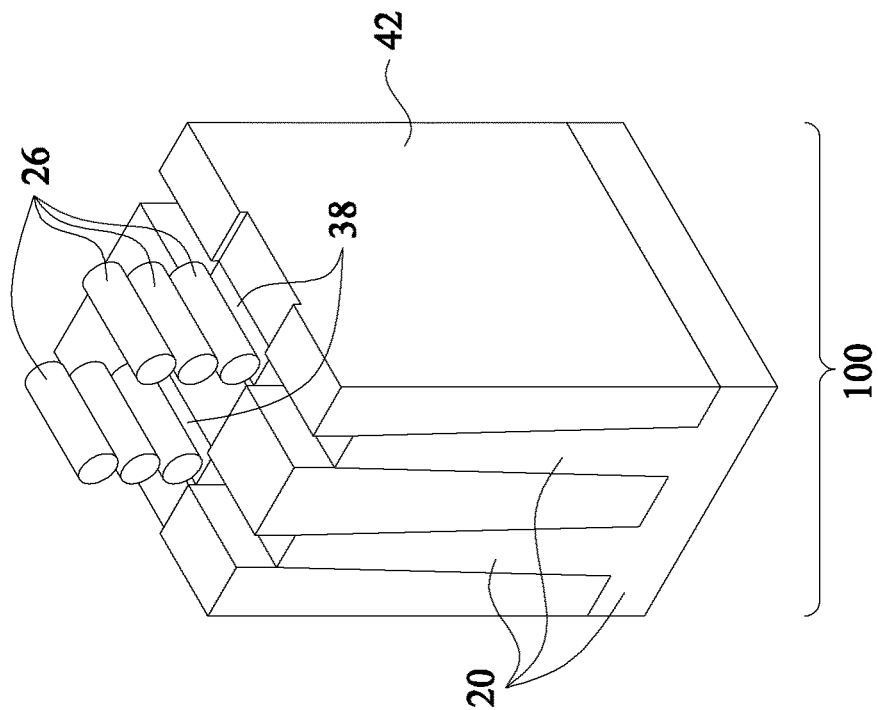
FIG. 14B

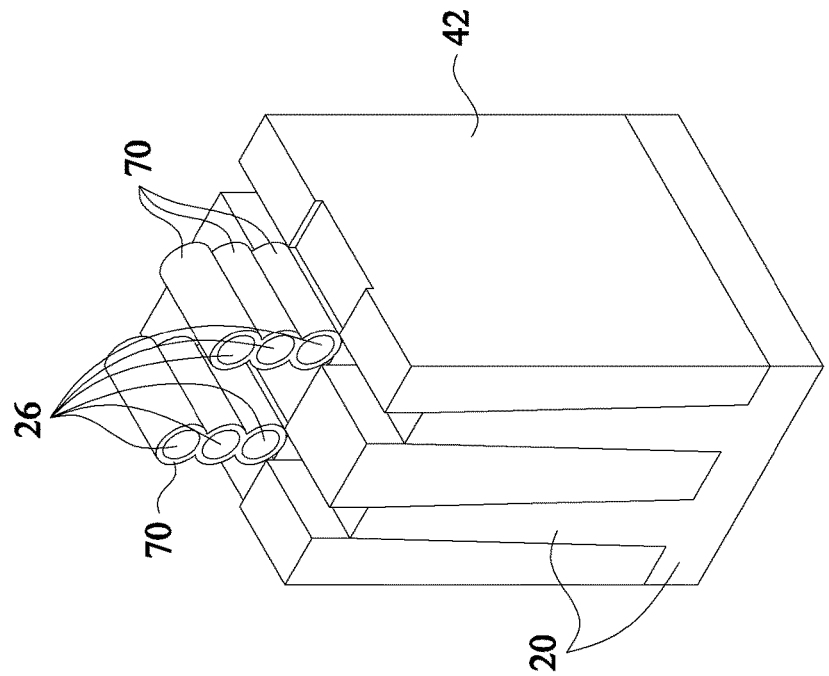
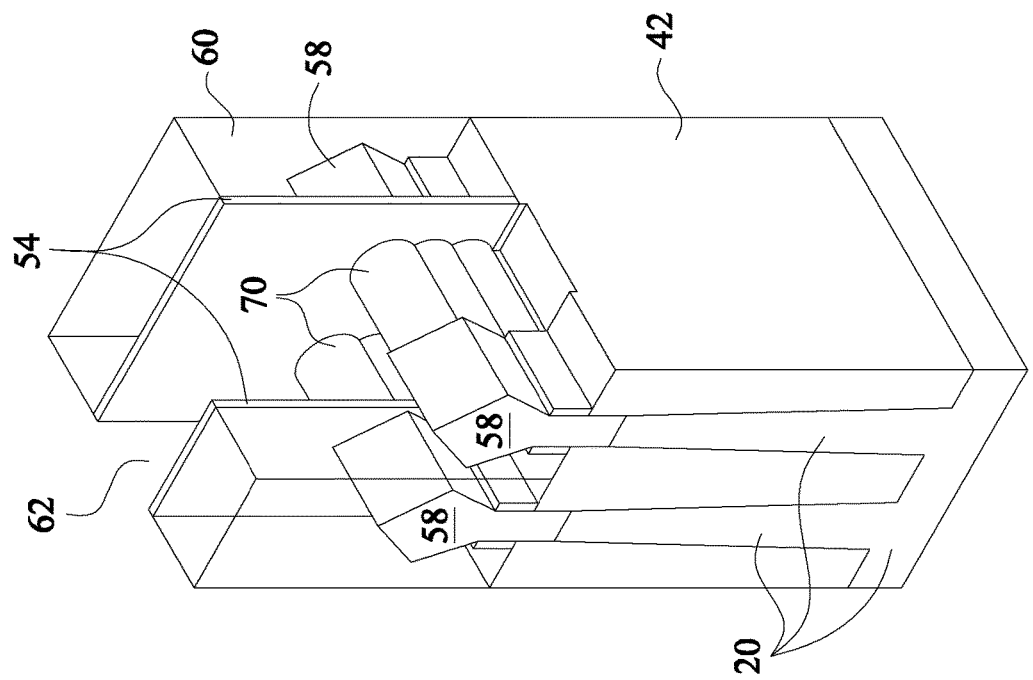
FIG. 15A
FIG. 15B

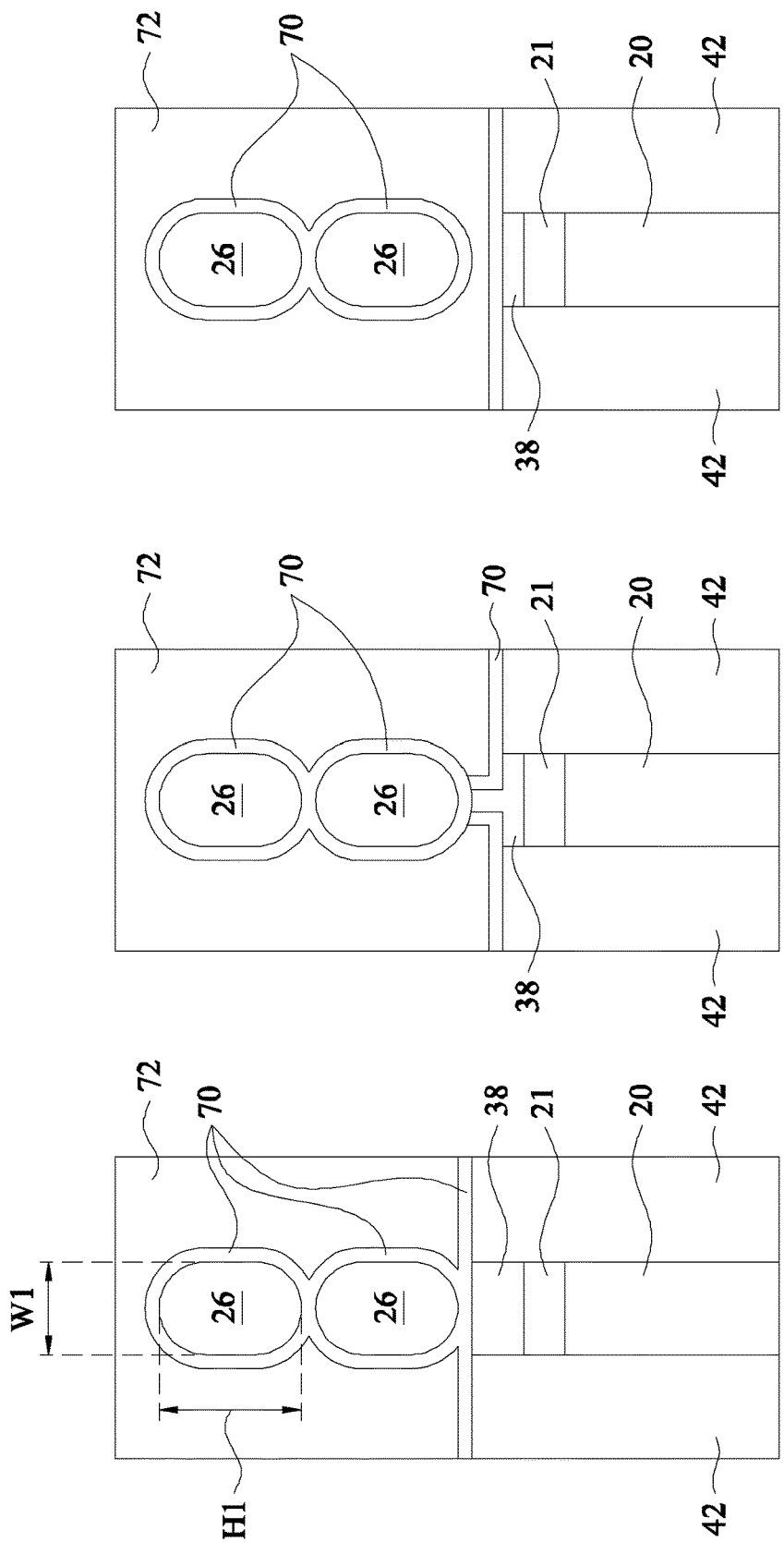

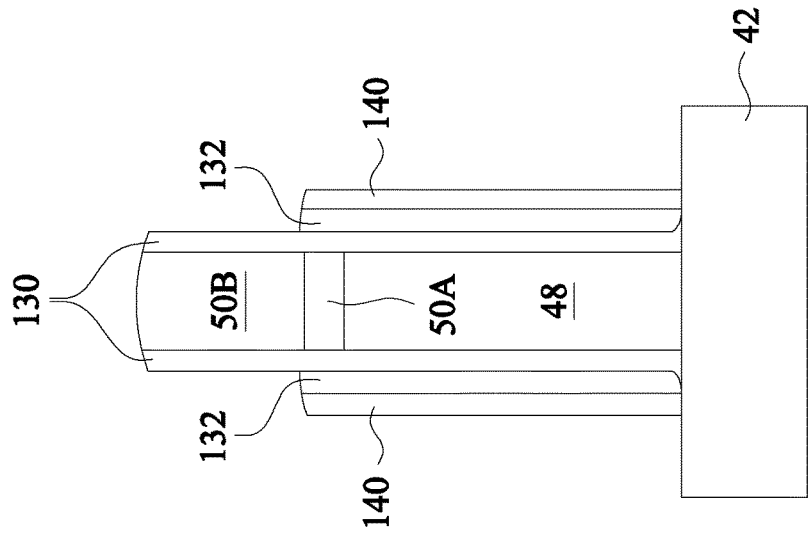
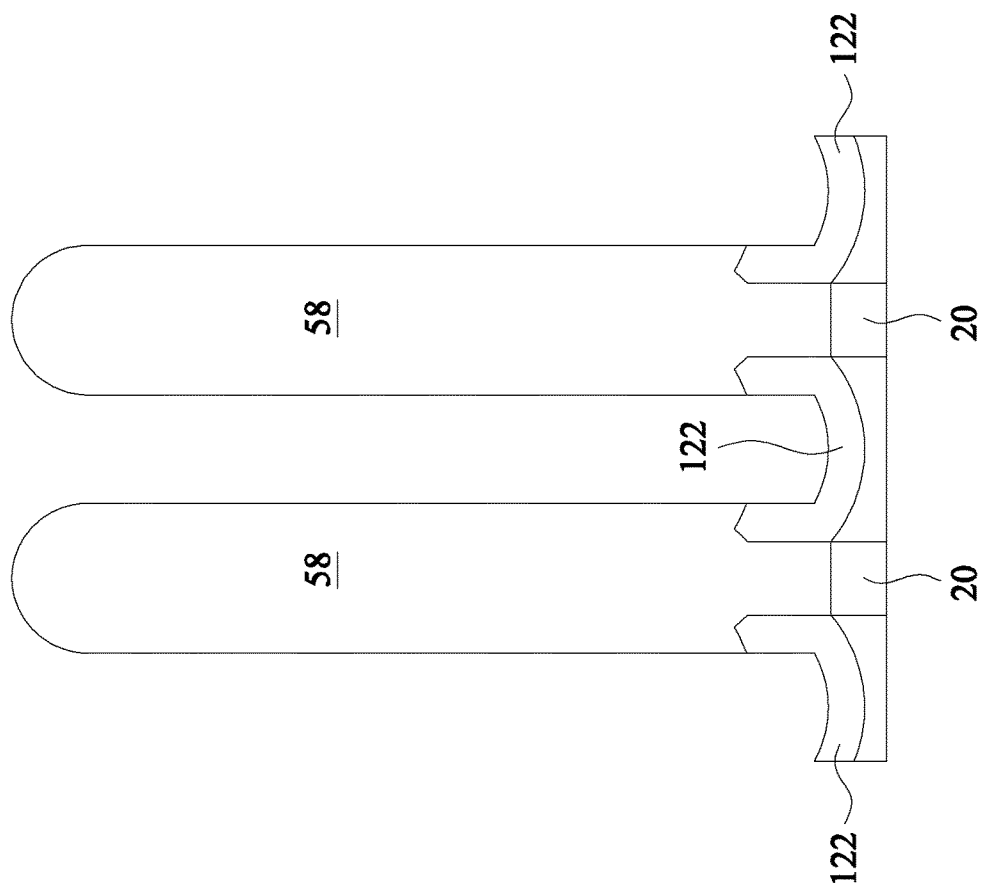
FIG. 38A
FIG. 38B

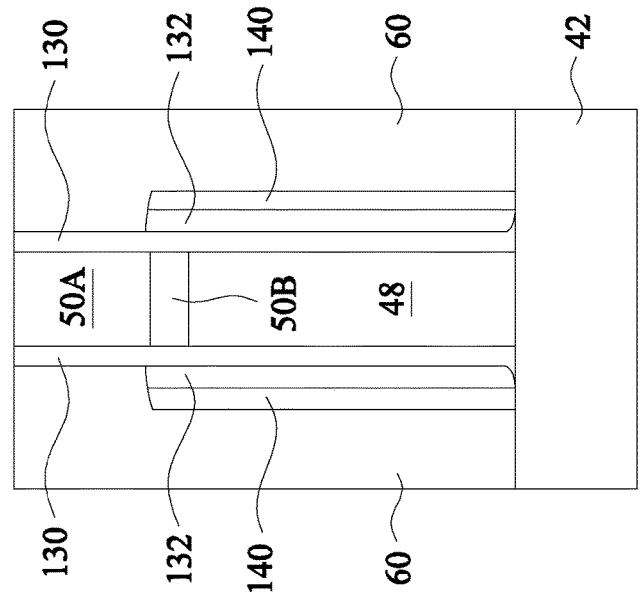
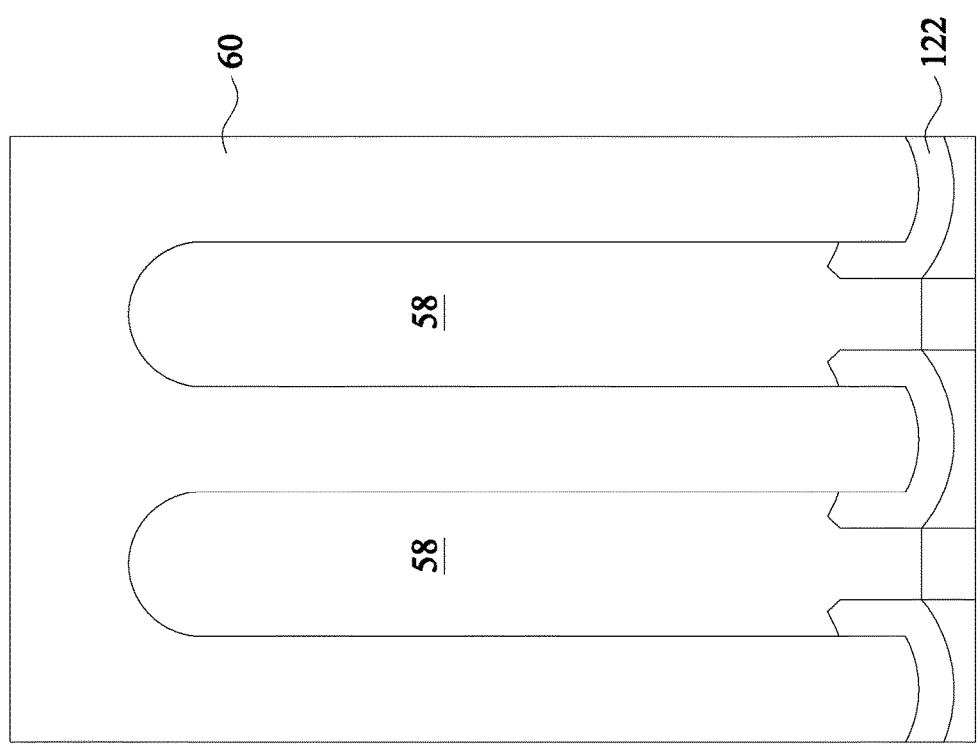
FIG. 39B
FIG. 39A

STACKED GATE-ALL-AROUND FINFET AND METHOD FORMING THE SAME

PRIORITY CLAIM

This application claims the priority to U.S. Provisional Application No. 62/115,558, filed Feb. 12, 2015 entitled, "Stacked Gate-All-Around FinFET and Method Forming the Same" application is hereby incorporated herein by reference.

CROSS-REFERENCE

This application relates to the following commonly-assigned U.S. patent application: application Ser. No. 14/317,069, filed Jun. 27, 2014, and entitled "Method of Forming Semiconductor structure with Horizontal Gate All Around Structure;" which application is hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 21D are cross-sectional views and perspective views of intermediate stages in the formation of a Fin Field-Effect Transistor (FinFET) in accordance with some exemplary embodiments;

FIGS. 23A, 23B, and 23C illustrate the cross-sectional views of channel regions and gate stacks of FinFETs in accordance with some embodiments;

FIGS. 24 through 40C illustrate cross-sectional views, top views, and perspective views in the formation of a FinFET in accordance with some exemplary embodiments.

DETAILED DESCRIPTION

Figure 2:
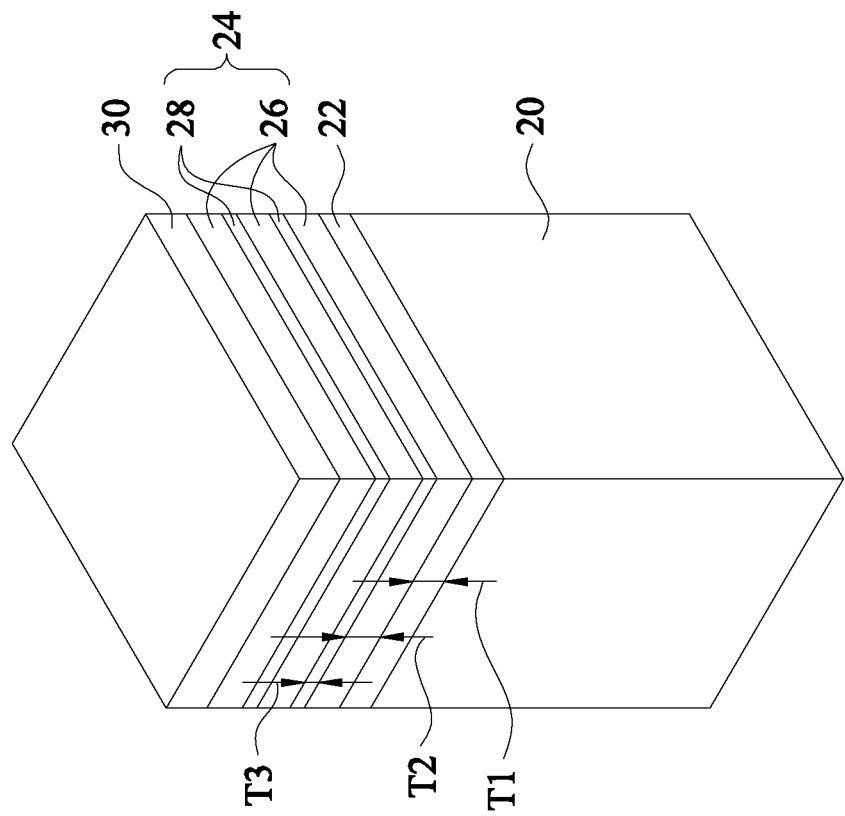

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) with Gate-All-Around (GAA) structures and the methods of forming the same are provided in accordance with various exemplary embodiments. The intermediate stages of forming the FinFETs are illustrated. The variations of the embodiments are discussed. Throughout the various views and illustrative embodiments, like reference numbers are used to designate like elements. It is appreciated that although FIGS. 1 through 23C and FIGS. 24 through 40C illustrate different embodiments, these embodiments may be combined in the formation of the same FinFET. For example, the embodiments shown in FIGS. 1 through 23C include the formation of channel regions and gate stacks of FinFETs, and the embodiments shown in FIGS. 24 through 40C include the formation of the source/drain regions and source/drain silicides of FinFETs. The formation of the channel regions and gate stacks and the formation of the source/drain regions and source/drain silicides in accordance with the embodiments of the present disclosure may thus be combined to form a FinFET.

FIGS. 1 through 21D illustrate the perspective views and cross-sectional views of intermediate stages in the formation of a FinFET in accordance with some embodiments. The steps shown in FIGS. 1 through 21D are also illustrated schematically in the process flow 300 shown in FIG. 22. In the subsequent discussion, the process steps shown in FIGS. 1 through 21D are discussed referring to the process steps in FIG. 22.

Figure 1:
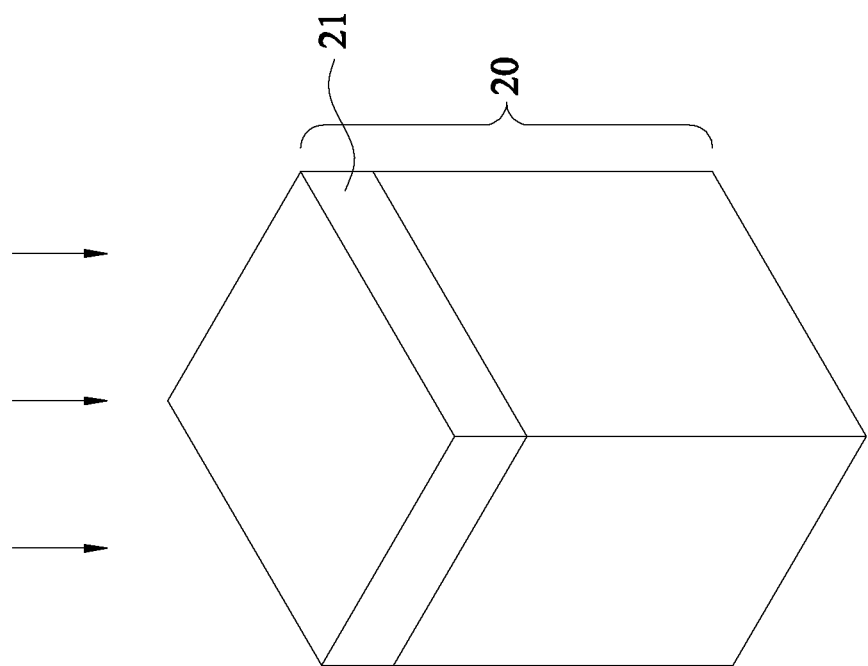

FIG. 1 illustrates a cross-sectional view of substrate 20, which may be a part of a wafer. Substrate 20 may be a semiconductor substrate, which may further be a silicon substrate, a silicon carbon substrate, a silicon-on-insulator substrate or a substrate formed of other semiconductor materials. Substrate 20 may be lightly doped with a p-type or an n-type impurity. An Anti-Punch-Through (APT) implantation (illustrated by arrows) is then preformed on a top portion of substrate 20 to form APT region 21. The respective step is shown as step 302 in the process flow shown in FIG. 22. The conductivity type of the dopants implanted in the APT is the same as that of the well region (not shown). APT layer 21 extends under the subsequently formed source/drain regions 58 (FIG. 21A), and are used to reduce the leakage from source/drain regions 58 to substrate 20. The doping concentration in APT layer 21 may be in the range between about $1E18/cm^3$ and about $1E19/cm^3$. For clarity, in subsequent drawings, APT region 21 is not illustrated.

Referring to FIG. 2, silicon germanium (SiGe) layer 22 and semiconductor stack 24 are formed over substrate 20 through epitaxy. The respective step is shown as step 304 in the process flow shown in FIG. 22. Accordingly, SiGe layer 22 and semiconductor stack 24 form crystalline layers. In accordance with some embodiments of the present disclosure, the thickness T1 of SiGe layer 22 is in the range between about 5 nm and about 8 nm. The germanium percentage (atomic percentage) of SiGe layer 22 is in the range between about 25 percent and about 35 percent, while higher or lower germanium percentages may be used. It is appreciated, however, that the values recited throughout the description are examples, and may be changed to different values.

Over SiGe layer 22 is semiconductor stack 24. In accordance with some embodiments, semiconductor stack 24 comprises semiconductor layers 26 and 28 stacked alternatively. Semiconductor layers 26 may be pure silicon layers that are free from germanium. Semiconductor layers 26 may also be substantially pure silicon layers, for example, with a germanium percentage lower than about 1 percent. Furthermore, semiconductor layers 26 may be intrinsic, which are not doped with p-type and n-type impurities. There may be two, three, four, or more of semiconductor layers 26. In accordance with some embodiments, thickness T2 of semiconductor layers 26 is in the range between about 6 nm and about 12 nm.

Semiconductor layers 28 are SiGe layers having a germanium percentage lower than the germanium percentage in SiGe layer 22. In accordance with some embodiments of the present disclosure, the germanium percentage of SiGe layers 28 is in the range between about 10 percent and about 20 percent. Furthermore, a difference between the germanium percentage of SiGe layer 22 and the germanium percentage of SiGe layers 28 may be greater than about 15 percent or higher. In accordance with some embodiments, thickness T3 of SiGe layers 28 is in the range between about 2 nm and about 6 nm.

Hard mask 30 is formed over semiconductor stack 24. In accordance with some embodiments of the present disclosure, hard mask 30 is formed of silicon nitride, silicon oxynitride, silicon carbide, silicon carbo-nitride, or the like.

Figure 3:
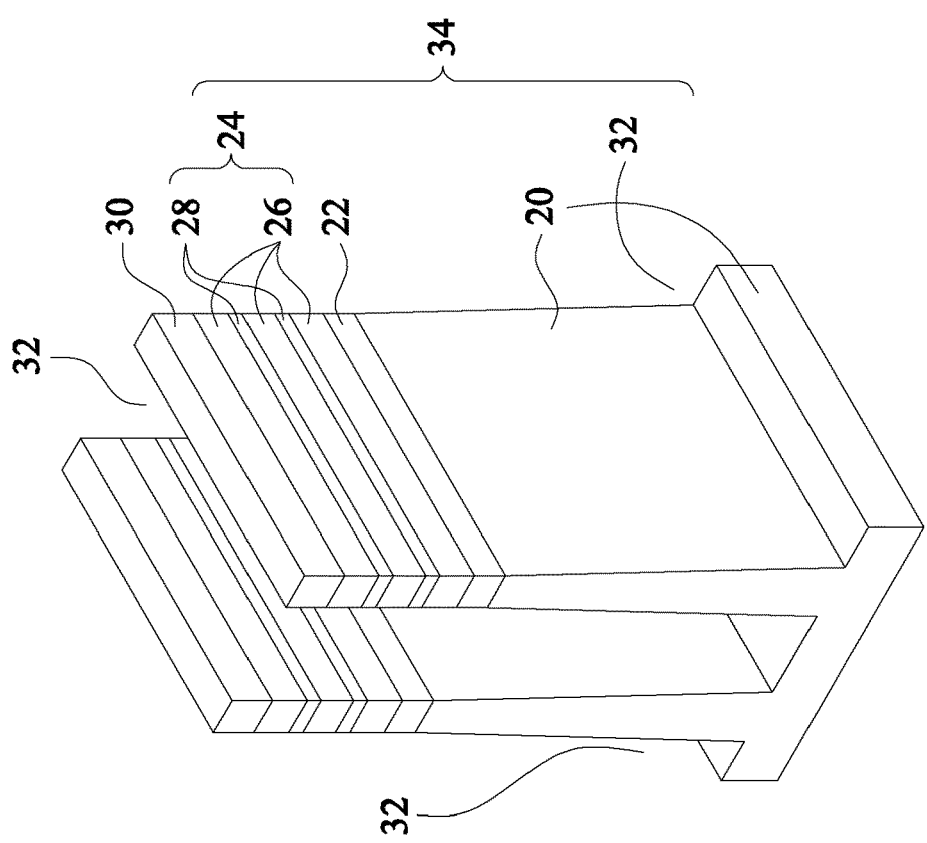

Next, as shown in FIG. 3, hard mask 30, semiconductor stack 24, SiGe layer 22 and substrate 20 are patterned to form trenches 32. The respective step is shown as step 306 in the process flow shown in FIG. 22. Accordingly, semiconductor strips 34 are formed. Trenches 32 extend into substrate 20, and have lengthwise directions parallel to each other. The remaining portions of semiconductor stack 24 are accordingly referred to as semiconductor strips 24 alternatively.

Figure 4:
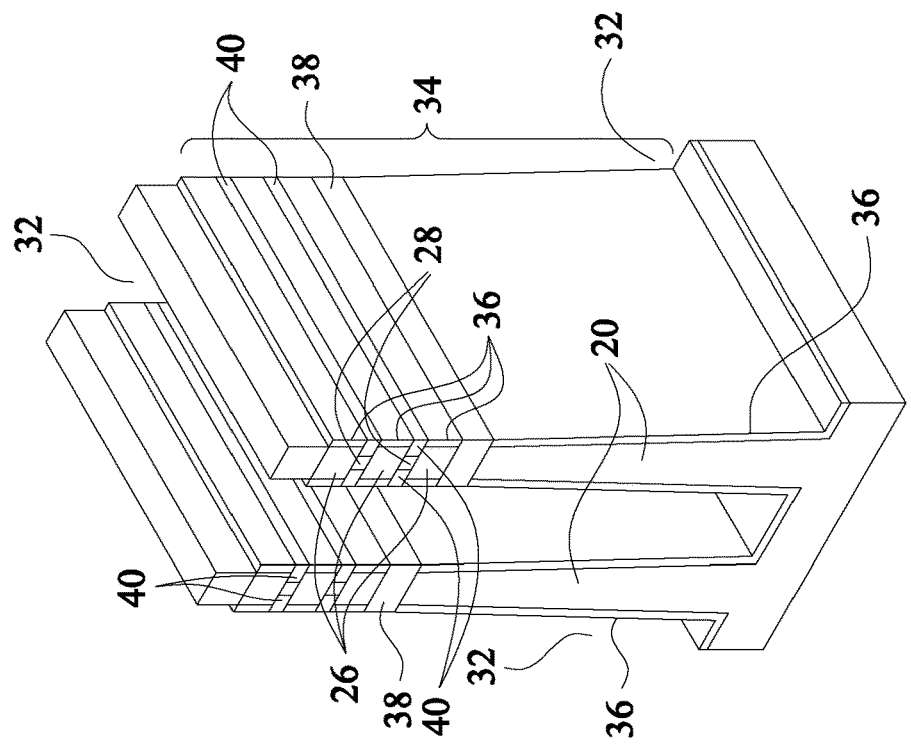

Referring to FIG. 4, an oxidation process is performed on the exposed portions of semiconductor strips 34. The respective step is shown as step 308 in the process flow shown in FIG. 22. In accordance with some embodiments of the present disclosure, before the oxidation, a trim step is performed to trim SiGe strips 22 and 28, with silicon strips 26 not trimmed. The trimming results in SiGe layers 22 and 28 to be recessed laterally from the respective edges of silicon strips 26. The trimming has the effect of reducing the width of SiGe layer 22, so that in the subsequent oxidation, SiGe layer 22 can be fully oxidized without requiring the time and/or temperature for the oxidation to be increased too much.

As a result of the oxidation, SiGe layer 22 is fully oxidized to form silicon germanium oxide regions 38, and at least the outer portions of SiGe strips 28 are oxidized to form silicon germanium oxide regions 40. The thickness of silicon germanium oxide regions 38 may be in the range between about 5 nm and about 20 nm. In some embodiments, the oxidation is performed at a temperature in the range between about 400° C. and 600° C. The oxidation time may range between about 2 minutes and about 4 hours, for example. The oxidation of silicon in silicon germanium is easier than the oxidation of germanium in the same silicon germanium region. Accordingly, the silicon atoms in semiconductor strips 28 are oxidized, and the germanium atoms in semiconductor strips 28 may diffuse inwardly toward the centers of SiGe strips 28, and hence the germanium percentage in the remaining SiGe strips 28 is increased over that in the SiGe strips 28 before the oxidation.

During the oxidation, silicon oxide layers 36 are also formed on the exposed surfaces of substrate 20 and silicon strips 26. Since the oxidation rate of SiGe (or silicon) regions increase with the increase in the percentages of germanium, the oxidation of silicon layers 26 and substrate 20 is much slower than the oxidation of SiGe layer 22 and SiGe strips 28. Accordingly, silicon oxide layers 36 are thin, and the majority of silicon layers 26 and the portions (referred to as strip portions hereinafter) of substrate 20 in strips 34 are not oxidized.

Figure 5:
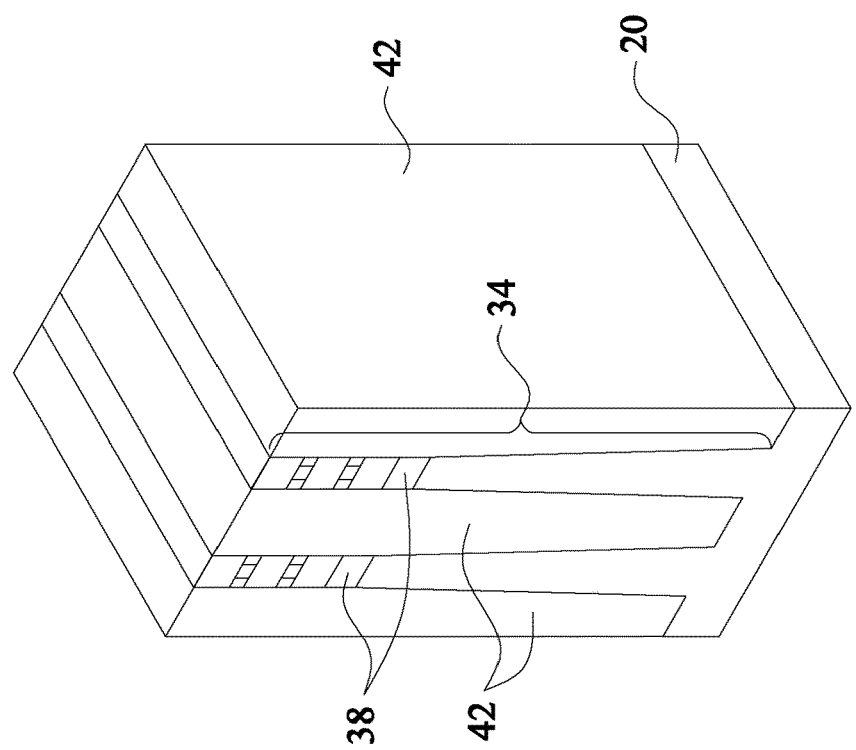

Next, as shown in FIG. 5, isolation regions 42, which may be Shallow Trench Isolation (STI) regions, are formed in trenches 32 (FIG. 4). The formation may include filling trenches 32 with a dielectric layer(s), for example, using Flowable Chemical Vapor Deposition (FCVD), and performing a Chemical Mechanical Polish (CMP) to level the top surface of the dielectric material with the top surface of hard mask 30. After the CMP, hard mask layer 30 (FIG. 4) is removed.

Figure 6:
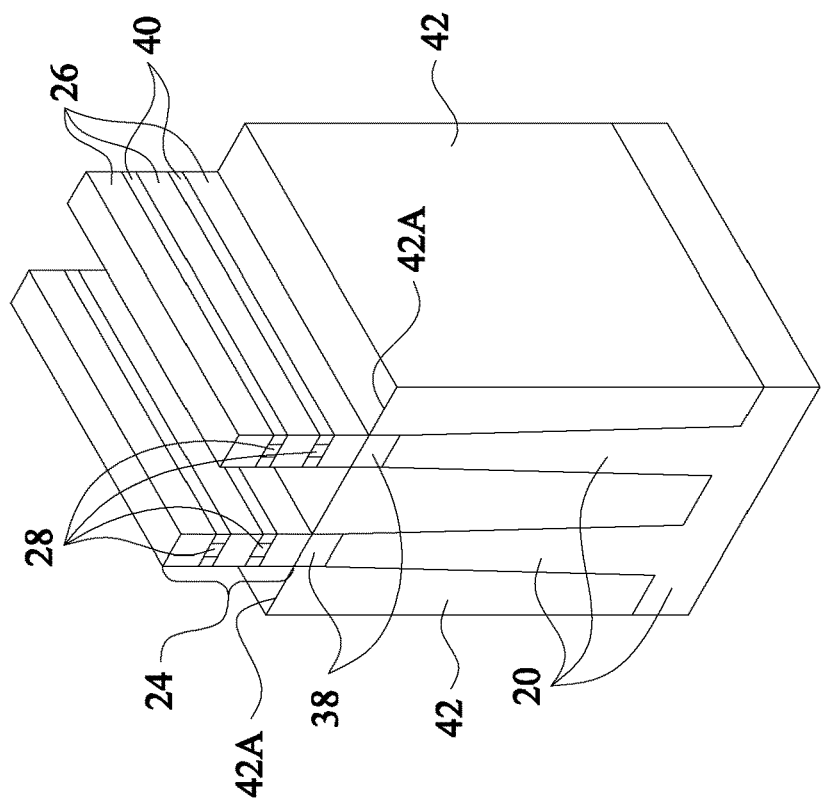

Next, referring to FIG. 6, STI regions 42 are recessed. The steps shown in FIGS. 5 and 6 are shown as step 310 in the process flow shown in FIG. 22. The top surface 42A of the resulting STI regions 42 may be level with the top surface or the bottom surface of silicon germanium oxide region 38, or may be at any intermediate level between the top surface and the bottom surface of silicon germanium oxide regions 38. Throughout the description, semiconductor stack 24 is also referred to as semiconductor fins 24 hereinafter.

Figure 7:
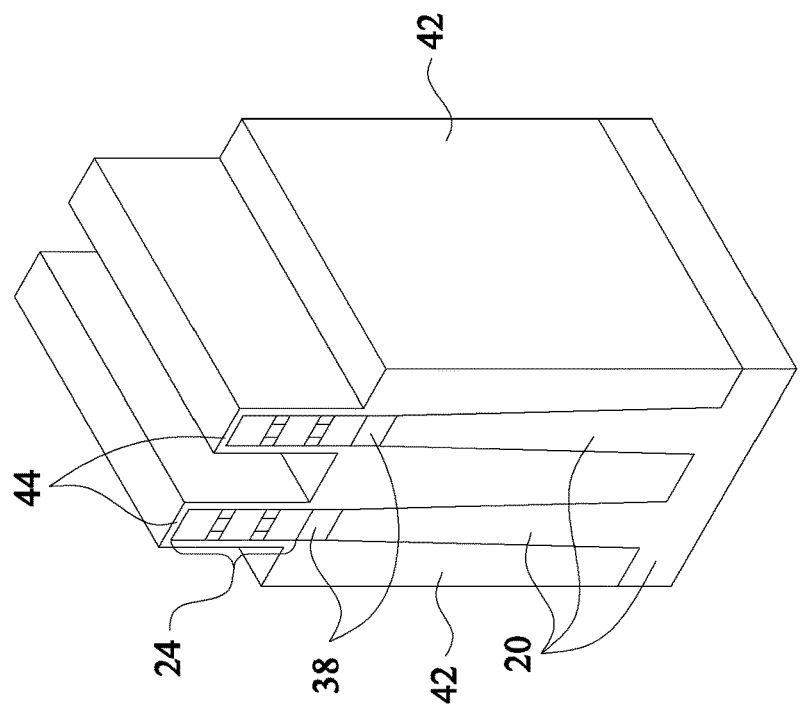

FIG. 7 illustrates the formation of dummy oxide layer 44, which may include silicon oxide in accordance with some embodiments. Hence, dummy oxide layer 44 protects the sidewalls of semiconductor strips 24, silicon germanium oxide regions 38, and the top surfaces of semiconductor stack 24. Dummy oxide layer 44 also extends on the top surfaces of STI regions 42. Since dummy oxide layer 44 and STI regions 42 may be formed of the same dielectric material (such as silicon oxide), the interface between dummy oxide layer 44 and STI regions 42 are not shown although they are distinguishable in some embodiments. In other embodiments, the interface is not distinguishable.

Figure 8:
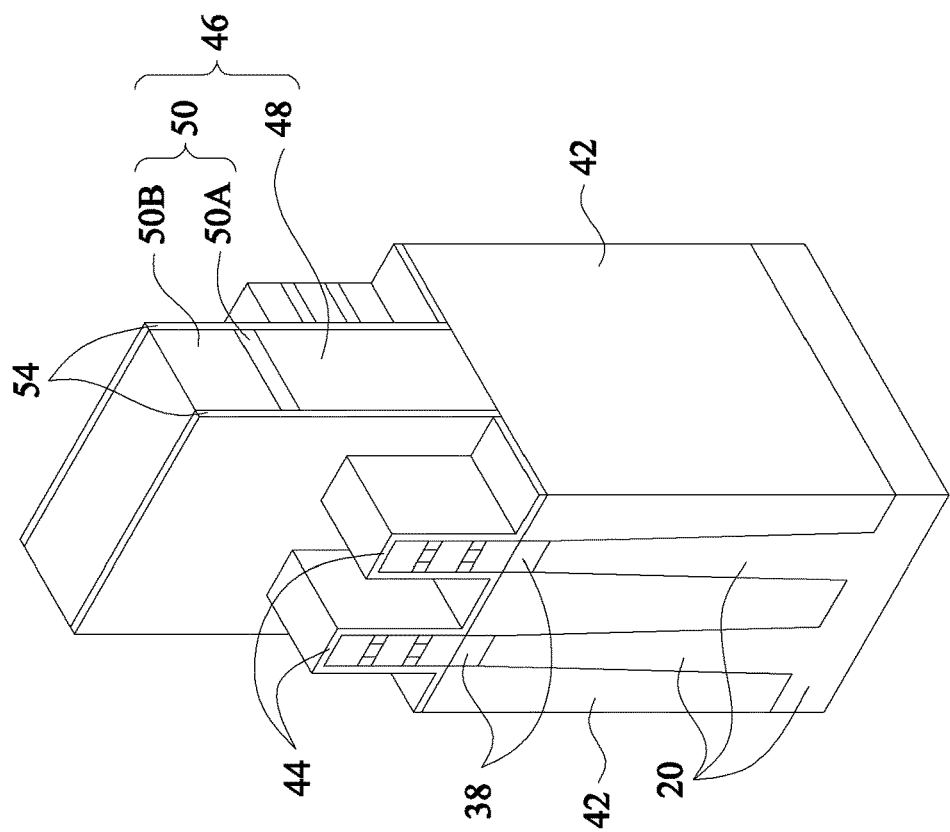

Referring to FIG. 8, dummy gate stack 46 is formed. The respective step is shown as step 312 in the process flow shown in FIG. 22. In accordance with some embodiments of the present disclosure, dummy gate stack 46 includes dummy gate electrode 48, which may be formed, for example, using polysilicon. Dummy gate stack 46 may also include hard mask layer 50 over dummy gate electrode 48.

Hard mask layer 50 may include silicon nitride and/or silicon oxide, for example, and may be a single layer or a composite layer including a plurality of layers. In some embodiments, hard mask layer 50 includes silicon nitride layer 50A and silicon oxide layer 50B over silicon nitride layer 50A. Dummy gate stack 46 has a lengthwise direction substantially perpendicular to the lengthwise direction of semiconductor fins 24.

Gate spacers 54 are formed on the sidewalls of dummy gate stack 46. In accordance with some embodiments of the present disclosure, gate spacers 54 are formed of silicon nitride, and may have a single-layer structure. In alternative embodiments, gate spacers 54 have a composite structure including a plurality of layers. For example, gate spacers 54 may include a silicon oxide layer, and a silicon nitride layer over the silicon oxide layer. Dummy gate stack 46 and gate spacers 54 cover a middle portion of each of semiconductor fins 24, leaving the opposite end portions not covered.

Figure 9:
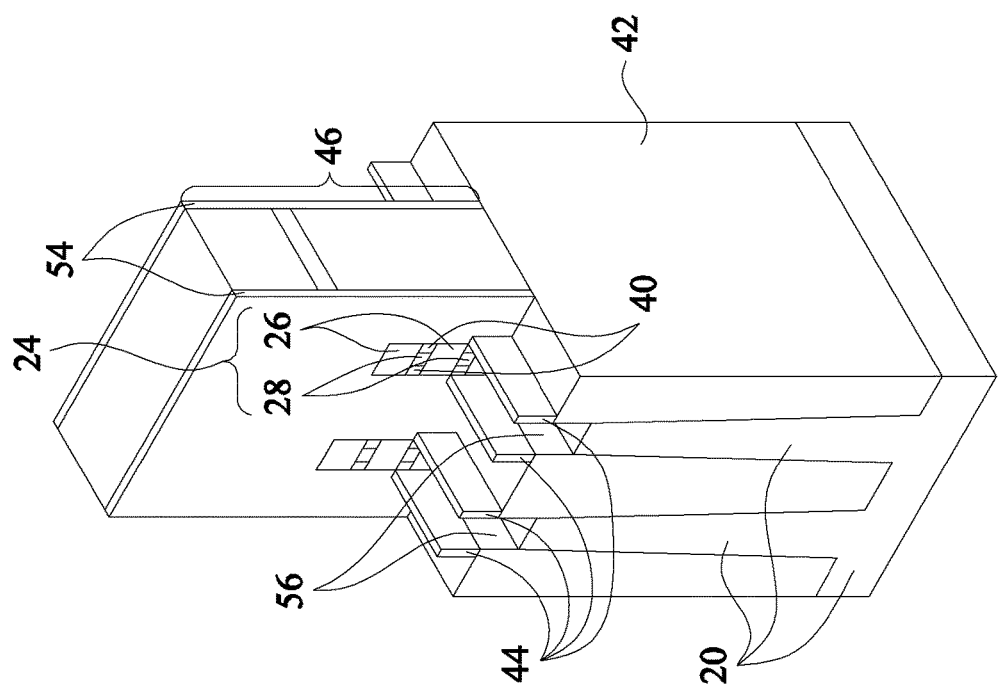

FIG. 9 illustrates the removal of the end portions of semiconductor fins 24. A dry etch(es) is performed to etch dummy oxide layer 44, semiconductor stacks 24, and silicon germanium oxide regions 38 as shown in FIG. 8. As a result, recesses 56 are formed. In accordance with some embodiments of the present disclosure, some portions of dummy oxide layer 44 may be left standing over and aligned to the edges of STI regions 42, with recesses 56 formed therebetween.

Figure 10:
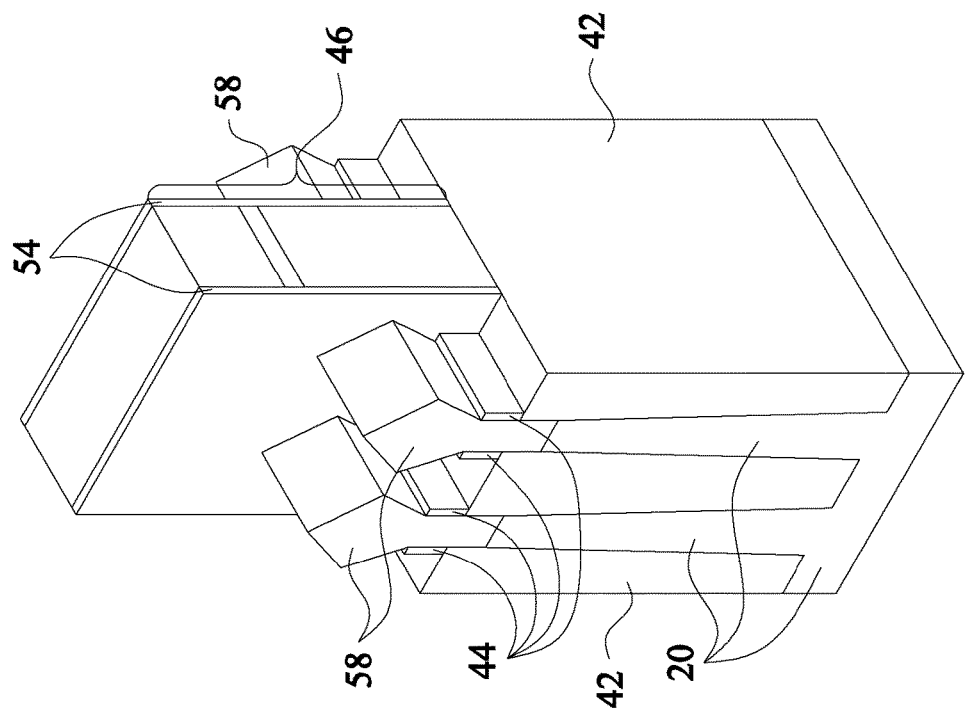

Next, referring to FIG. 10, epitaxy regions (source/drain regions) 58 are formed by selectively growing a semiconductor material from recesses 56 (FIG. 9). In accordance with some embodiments of the present disclosure, the formation of source/drain regions 58 includes an epitaxy growth. In accordance with alternative embodiments, the formation of source/drain regions 58 is achieved by adopting the process steps shown in FIGS. 28 through 37A. The respective step is shown as step 314 in the process flow shown in FIG. 22. As illustrated in FIG. 10, due to the blocking of the remaining portions of dummy oxide layer 44, source/drain regions 58 are first grown vertically in recesses 56 (FIG. 9), during which time source/drain regions 58 do not grow horizontally. After recesses 56 are fully filled, source/drain regions 58 are grown both vertically and horizontally to form facets.

In some exemplary embodiments in which the resulting FinFET is an n-type FinFET, source/drain regions 58 comprise silicon phosphorous (SiP) or phosphorous-doped silicon carbon (SiCP). In alternative exemplary embodiments in which the resulting FinFET is a p-type FinFET, source/drain regions 58 comprise SiGe, and a p-type impurity such as boron or indium may be in-situ doped during the epitaxy.

Figure 11:
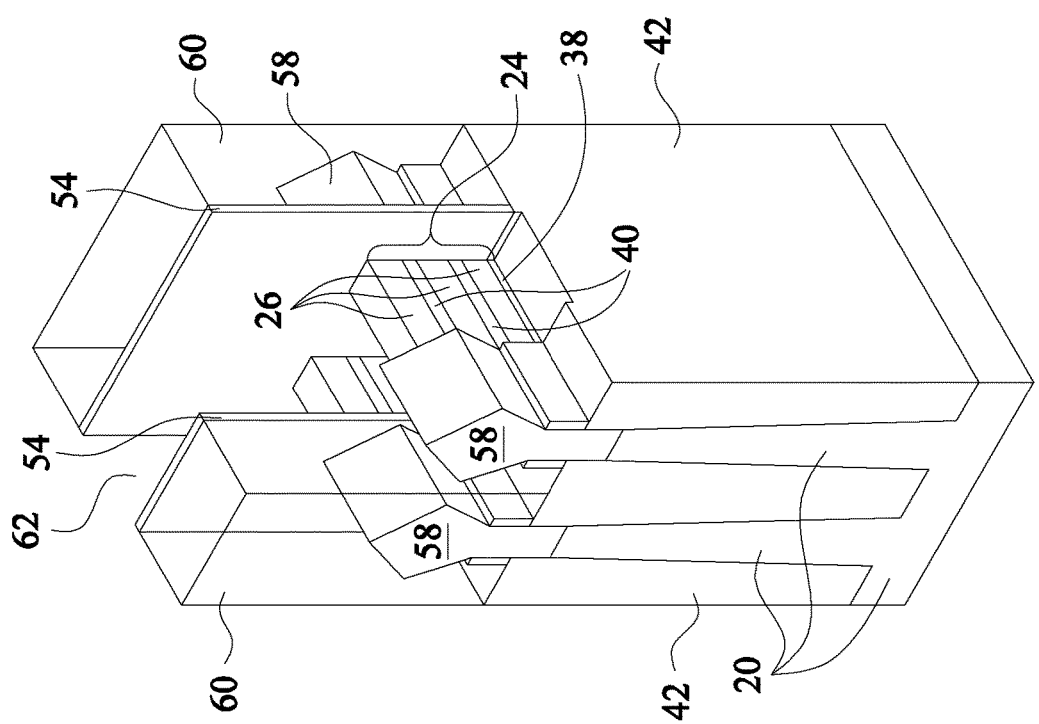

Next, as shown in FIG. 11, Inter-Layer Dielectric (ILD) 60 is formed. The respective step is shown as step 316 in the process flow shown in FIG. 22. A CMP is then performed to level the top surfaces of ILD 60, dummy gate stack 46 (FIG. 10), and gate spacers 54 (FIG. 10) with each other. Each of ILD 60, gate spacers 54, and insulation regions 42 may have distinguishable interfaces with the other ones of ILD 60, gate spacers 54, and STI regions 42 since they are formed in different process steps, having different densities, and/or comprise different dielectric materials.

Next, dummy gate 46 as shown in FIG. 10 is removed in an etching step, so that recess 62 is formed to extend into ILD 60, as shown in FIG. 11. The respective step is shown as step 318 in the process flow shown in FIG. 22. To illustrate the features behind the front portion of ILD 60, some front portions of ILD 60 are not shown in subsequent figures, so that the inner features may be illustrated. It is appreciated that the un-illustrated portions of ILD 60 still exist. After the removal of dummy gate stack 46, the middle portions of semiconductor stacks (fins) 24 are exposed to recess 62. During the removal of dummy gate stack 46, dummy gate oxide 44 (FIG. 7) is used as an etch stop layer when the top layer is etched. Dummy gate oxide 44 is then removed, and hence semiconductor fins 24 are exposed to recess 62.

Referring to FIG. 12A, an etching step is performed to remove silicon germanium oxide regions 40 (also refer to FIG. 9), concentrated semiconductor strips 28, and some top portions of silicon germanium oxide regions 38 (FIG. 8). The respective step is shown as step 320 in the process flow shown in FIG. 22. Accordingly, silicon strips 26 are separated from each other by gaps 64. In addition, the bottom one of silicon strips 26 may also be separated from the remaining silicon germanium oxide regions 38 by gaps 64. As a result, silicon strips 26 are suspended. The opposite ends of the suspended silicon strips 26 are connected to source/drain regions 58. It is appreciated that STI regions 42 include first portions underlying and exposed to recess 62, and second portions covered by gate spacers 54 and ILD 60. In accordance with some embodiments of the present disclosure, the top surfaces of the first portions of STI regions 42 are recessed to be lower than the top surfaces of the second portions of STI regions 42.

FIG. 12B illustrates a clearer view of the portions of silicon strips 26. ILD 60, source/drain regions 58, and gate spacers 54 as shown in FIG. 12A are not shown in FIG. 12B, although these features still exist.

Figure 13B:
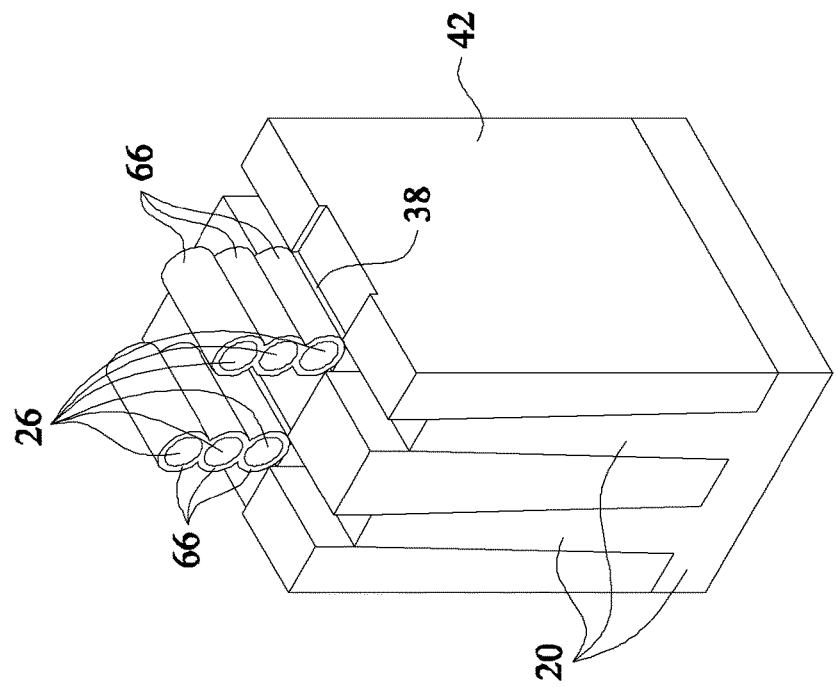
Figure 13A:
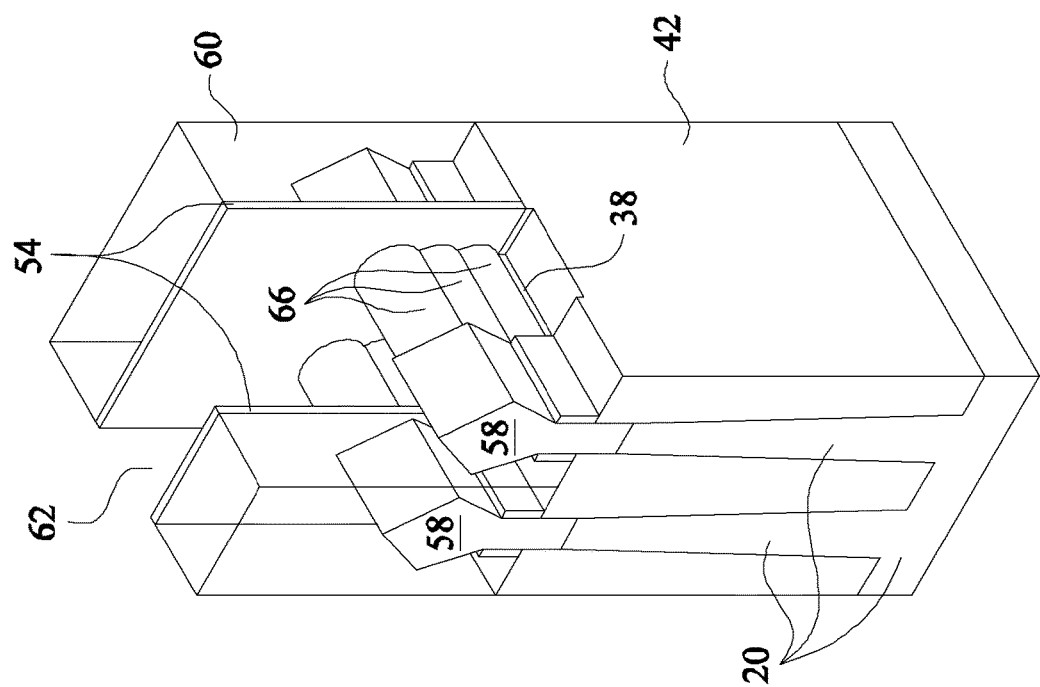

Referring to FIGS. 13A and 13B, an oxidation step is performed. The respective step is shown as step 322 in the process flow shown in FIG. 22. FIG. 13B also illustrates some portions of the structure shown in FIG. 13A, wherein ILD 60, source/drain regions 58, and gate spacers 54 as shown in FIG. 13A are not shown in FIG. 13B, although these features still exist. The oxidation may be performed using steam oxidation in water steam, thermal oxidation in oxygen ($O_2$), or the like. In accordance with some embodiments of the present disclosure, the oxidation is performed using water steam at a temperature in the range between about 400° C. and about 600° C. The duration of the oxidation may be in the range between about 20 seconds and about 20 minutes. As a result of the oxidation, the outer portions of silicon strips 26 are oxidized to form silicon oxide rings 66, which encircle the remaining portions of silicon strips 26, as shown in FIG. 13B. In some embodiments, the silicon oxide rings 66 formed from neighboring silicon strips 26 touch each other. In addition, the silicon oxide rings 66 formed from the bottom one of silicon strips 26 may be in contact with the top surface of silicon germanium oxide regions 38 in some embodiments. In alternative embodiments, the silicon oxide rings 66 formed from neighboring silicon strips 26 are spaced apart from each other.

In the oxidation, the core FinFETs in core circuits (also known as logic circuits) and the input/output (IO) FinFETs in IO circuits have their semiconductor strips oxidized simultaneously. The structure shown in FIGS. 13A and 13B illustrate the structures of both the core FinFETs and the IO FinFETs. In a subsequent step, as shown in FIG. 14A, photo resist 68 is formed to cover silicon oxide rings 66 in IO region 200, while core region 100 is not covered. An etching is then performed to remove silicon oxide rings 66 in core region 100, so that silicon strips 26 are exposed. On the other hand, the silicon oxide rings 66 in IO region 200 are protected from the removal, and hence will remain after the etching. The respective step is shown as step 324 in the process flow shown in FIG. 22. Photo resist 68 is then removed. After the etching, silicon strips 26 in core region 100 are again separated from each other by gaps, and the bottom one of silicon strips 26 is separated from the top surface of silicon germanium oxide region 38 by a gap. FIG. 14B illustrates some portions of the structure shown in FIG. 14A, wherein ILD 60, source/drain regions 58, and gate spacers 54 as shown in FIG. 14A are not shown in FIG. 14B, although these features still exist.

In a subsequent step, gate dielectric 70 is formed. The respective step is shown as step 326 in the process flow shown in FIG. 22. For a core FinFET in the core region (100 in FIGS. 14A and 14B), gate dielectric 70 is formed on the exposed surfaces of silicon strips 26 (FIGS. 14A and 14B). The resulting structure is shown in FIGS. 15A and 15B. For an IO FinFET in the IO region (200 in FIGS. 14A and 14B), gate dielectric 70 is formed on the already formed silicon oxide rings 66, and hence silicon oxide rings 66 become parts of gate dielectric 70. Accordingly, both the core FinFET and the IO FinFET have the structure shown in FIGS. 15A and 15B, except that the gate dielectric 70 of an IO FinFET is thicker than that of a core FinFET. Again, FIG. 15B also illustrates some portions of the structure shown in FIG. 15A, wherein ILD 60, source/drain regions 58, and gate spacers 54 as shown in FIG. 15A are not shown in FIG. 15B.

In accordance with some embodiments, the formation of gate dielectric 70 includes performing an interfacial (dielectric) layer, and then forming a high-k dielectric layer on the interfacial layer. The interfacial layer may include silicon oxide formed by treating the structure in FIGS. 14A and 14B in a chemical solution, so that silicon strips 26 are oxidized to form a chemical oxide (silicon oxide). As a result, the gate dielectric 70 in the IO region will be thicker than the gate dielectric 70 in the core region. The high-k dielectric is then deposited on the interfacial layer. In some embodiments, the high-k dielectric has a k value greater than about 7.0, and may include a metal oxide or a silicate of Hf, Al, Zr, La, and the like.

Figure 16A:
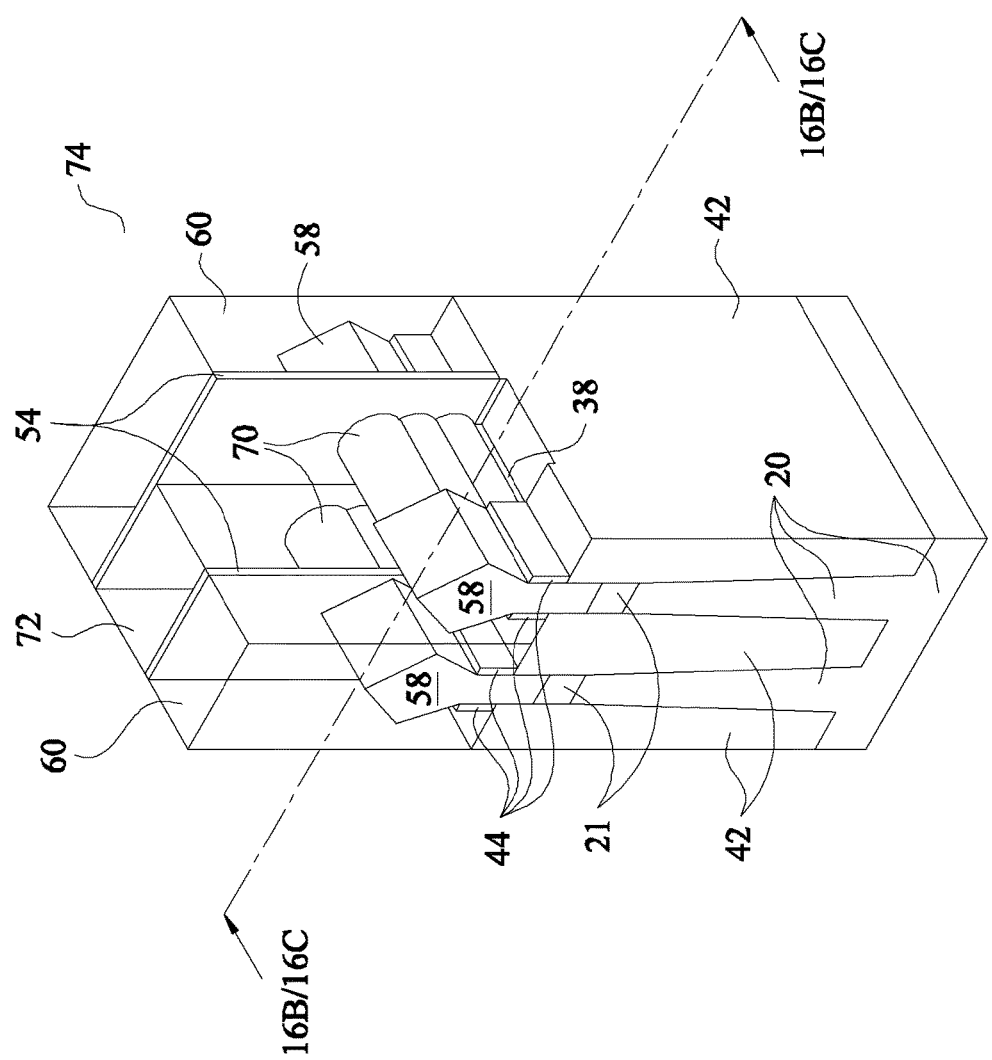

FIG. 16A illustrates the formation of gate electrode 72. The respective step is shown as step 328 in the process flow shown in FIG. 22. The formation includes filling recess 62 (FIG. 15A) with a conductive material, and performing a planarization such as a CMP. Gate electrode 72 may include a metal-containing material such as TiN, TaN, TaC, Co, Ru, Al, Cu, W, combinations thereof, or multi-layers thereof. FinFET 74 is thus formed. Anti-punch-through region 21 is underlying silicon germanium oxide region 38 and source/drain regions 58.

Figure 16C:
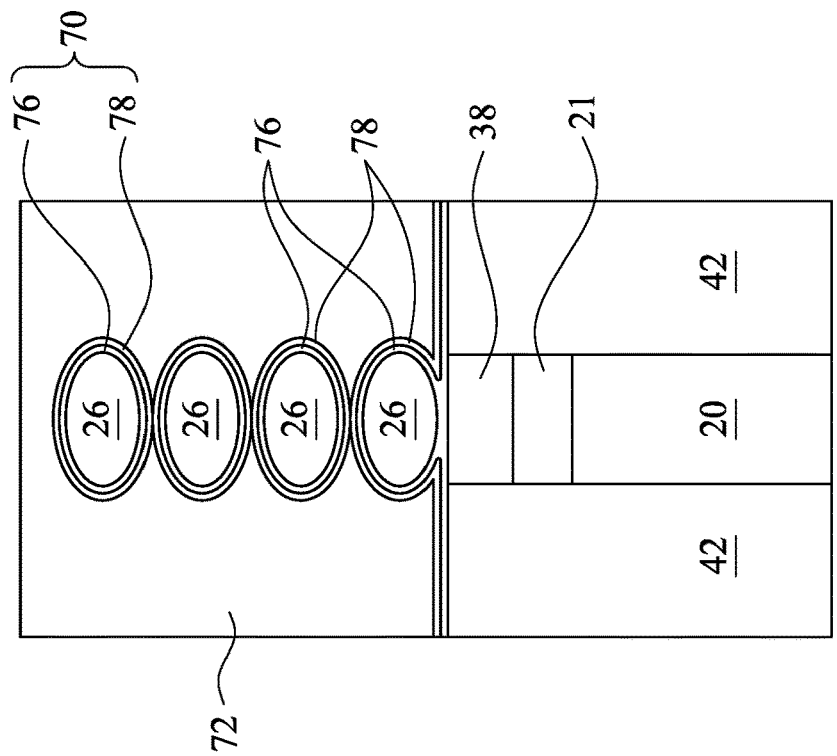
Figure 16B:
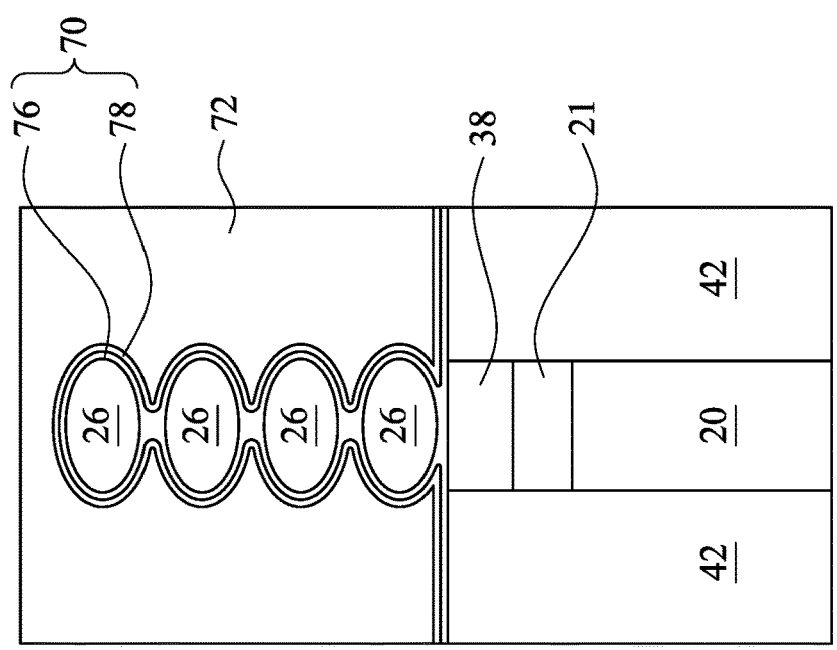

FIGS. 16B and 16C illustrate the cross-sectional views of some portions of FinFET 74 in FIG. 16A, wherein the cross-sectional views are obtained from the vertical plane containing line 16B/16C-16B/16C in FIG. 16A. As shown in FIGS. 16B and 16C, gate dielectric 70 fully fills the gap between neighboring silicon strips 26. Accordingly, gate electrode 72 will not be able to be filled into the gap between neighboring silicon strips 26, and will not be shorted to source/drain regions 58 (FIG. 16A).

FIGS. 16B and 16C also illustrate that gate dielectric 70 includes silicon oxide 76 and high-k dielectric 78 on the outer side of silicon oxide 76. When FinFET 74 is a core FinFET, silicon oxide 76 includes the interfacial layer. When FinFET 74 is an IO FinFET, silicon oxide 76 includes silicon oxide rings 66 (FIGS. 13A and 13B) and an interfacial layer. In FIG. 16B, silicon oxide 76 formed on neighboring silicon strips 26 contact with each other in accordance with some embodiments. In FIG. 16C, silicon oxides 76 formed on neighboring silicon strips 26 do not contact with each other, and high-k dielectric 78 fills the gap between the silicon oxides 76 that are formed on neighboring silicon strips 26 in accordance with some embodiments.

FIGS. 17A through 22B illustrate cross-sectional views of intermediate stages in the formation of a FinFET in accordance with alternative embodiments. Unless specified otherwise, the materials and the formation methods of the components in these embodiments are essentially the same as the like components, which are denoted by like reference numerals in the embodiments shown in FIGS. 1 through 16C. The details regarding the formation process and the materials of the components shown in FIGS. 17A through 22B may thus be found in the discussion of the embodiment shown in FIGS. 1 through 16C.

Figure 17A:
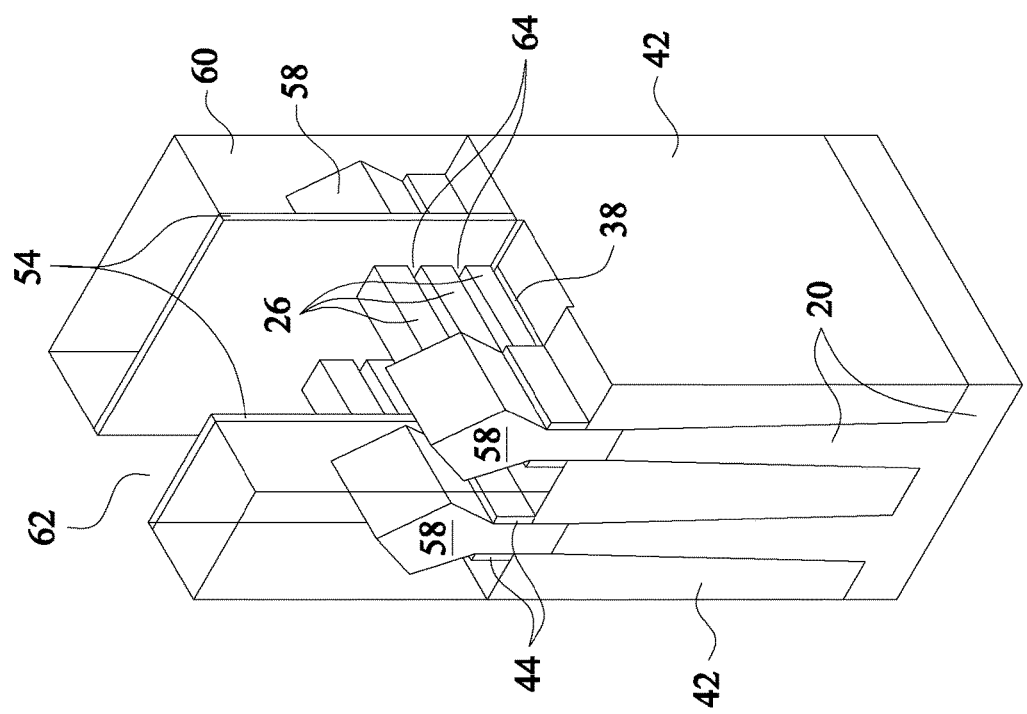
Figure 17B:
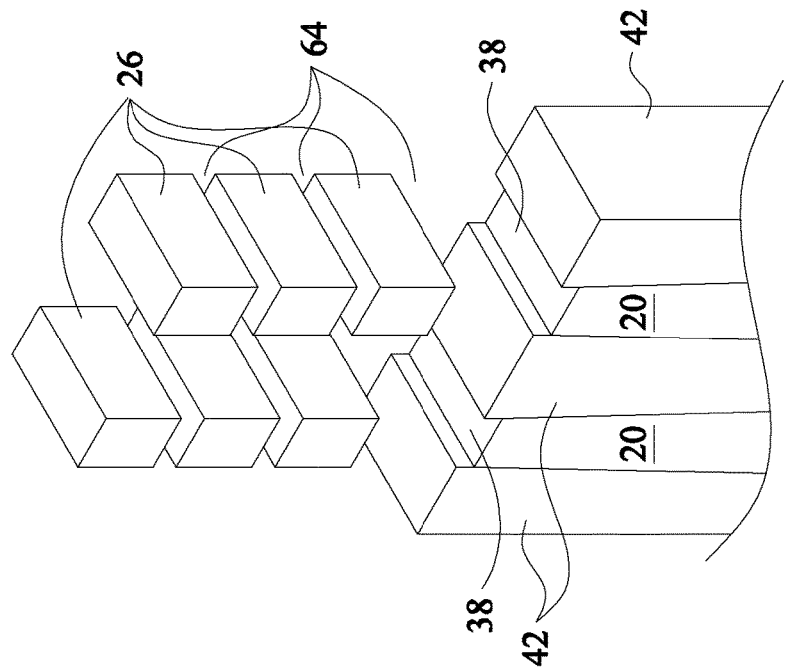

The initial steps of these embodiments are essentially the same as shown in FIGS. 1 through 11. Next, FIGS. 17A and 17B illustrate the etching step similar to the step shown in FIGS. 12A and 12B. Referring to FIG. 17A, an etching is performed to remove silicon germanium oxide regions 40 (also refer to FIG. 9), concentrated semiconductor strips 28, and some top portions of silicon germanium oxide region 38 (FIG. 8). Accordingly, silicon strips 26 are separated from each other by gaps 64. In addition, the bottom one of silicon strips 26 may also be separated from the remaining silicon germanium oxide regions 38 by gaps 64. Compared to the step shown in FIGS. 12A and 12B, the portions of STI regions 42 and silicon germanium oxide regions 38 are recessed lower than in FIGS. 12A and 12B. As a result, the gaps 64 between the bottom one of silicon strips 26 and the top surface of silicon germanium oxide regions 38 are higher than in FIGS. 12A and 12B.

Figure 18B:
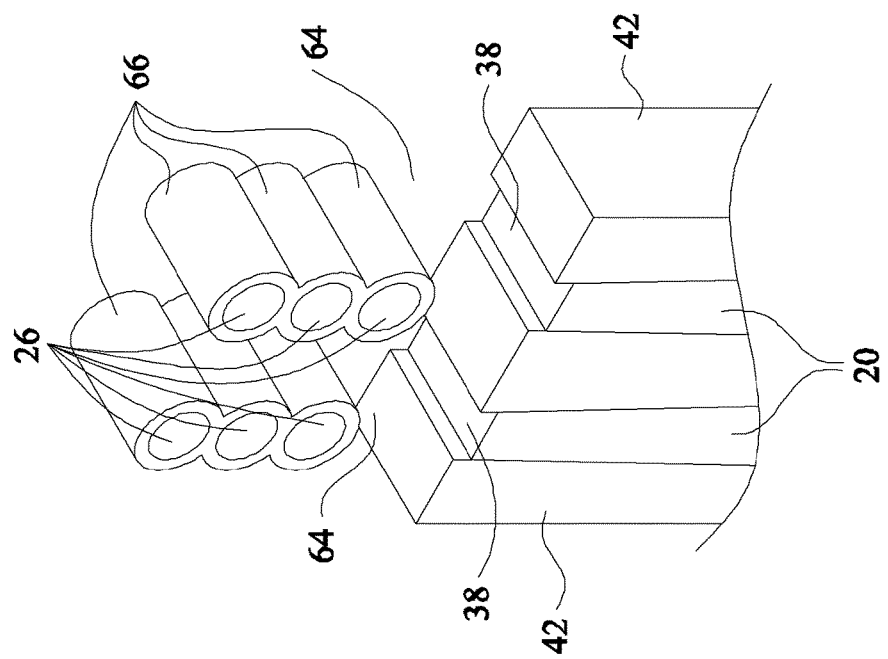
Figure 18A:
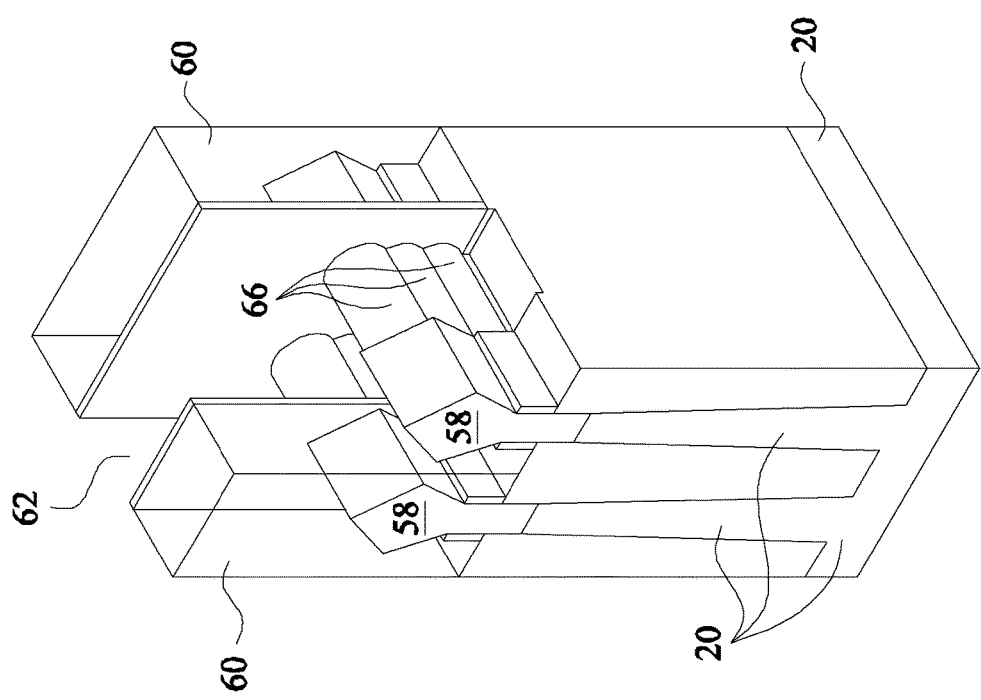
Figure 19B:
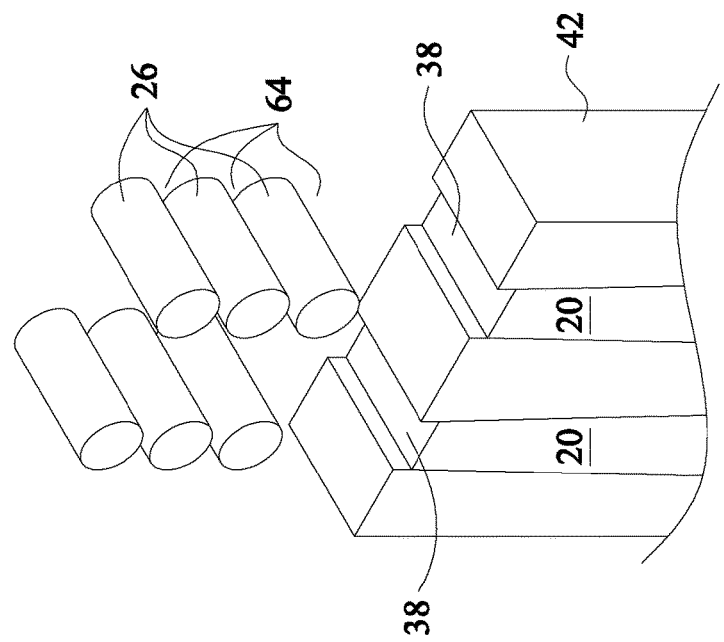
Figure 19A:
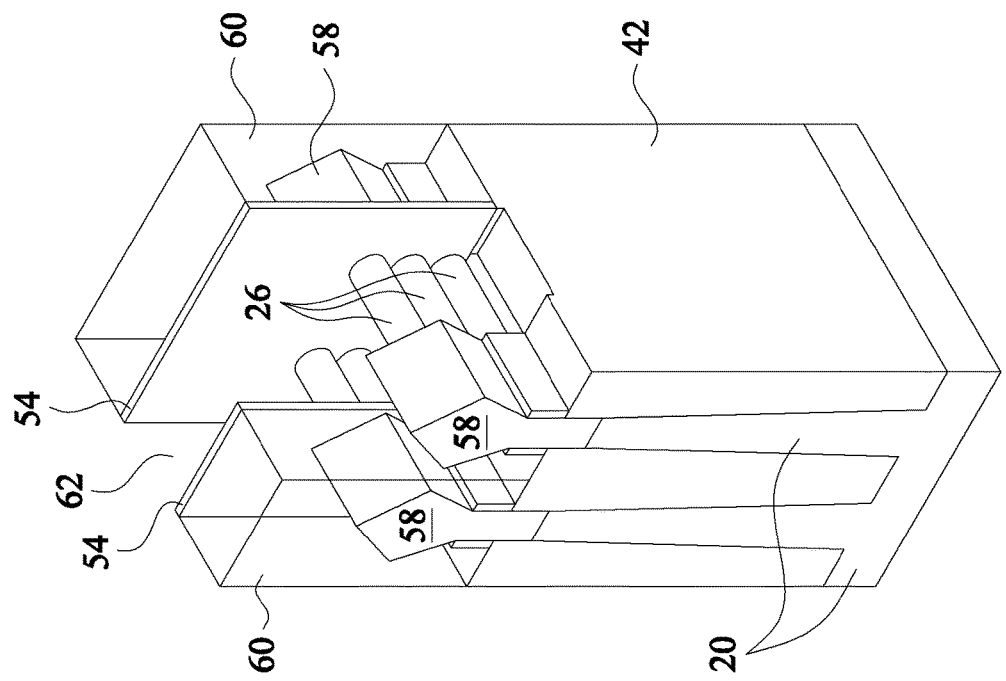
Figure 20B:
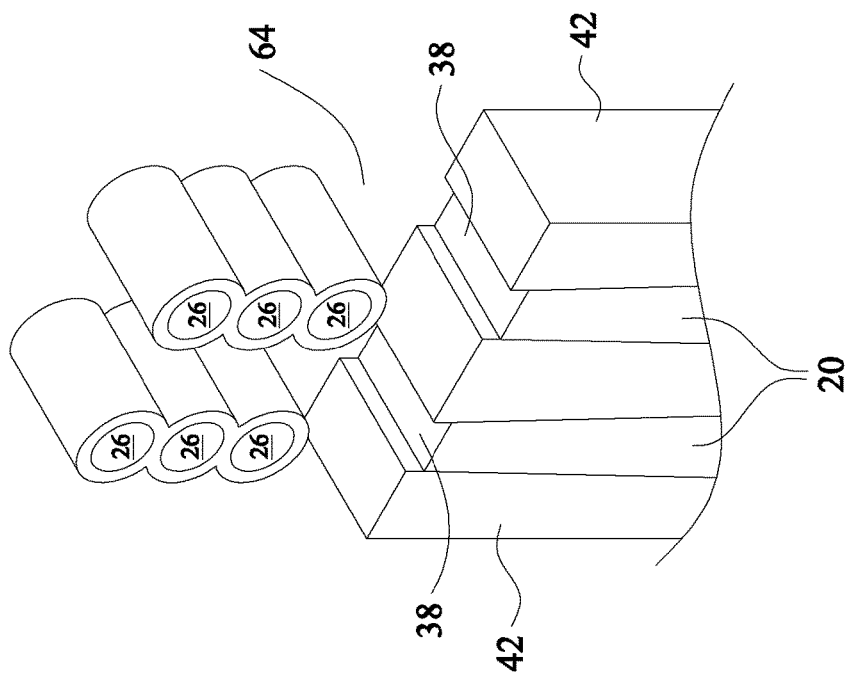
Figure 20A:
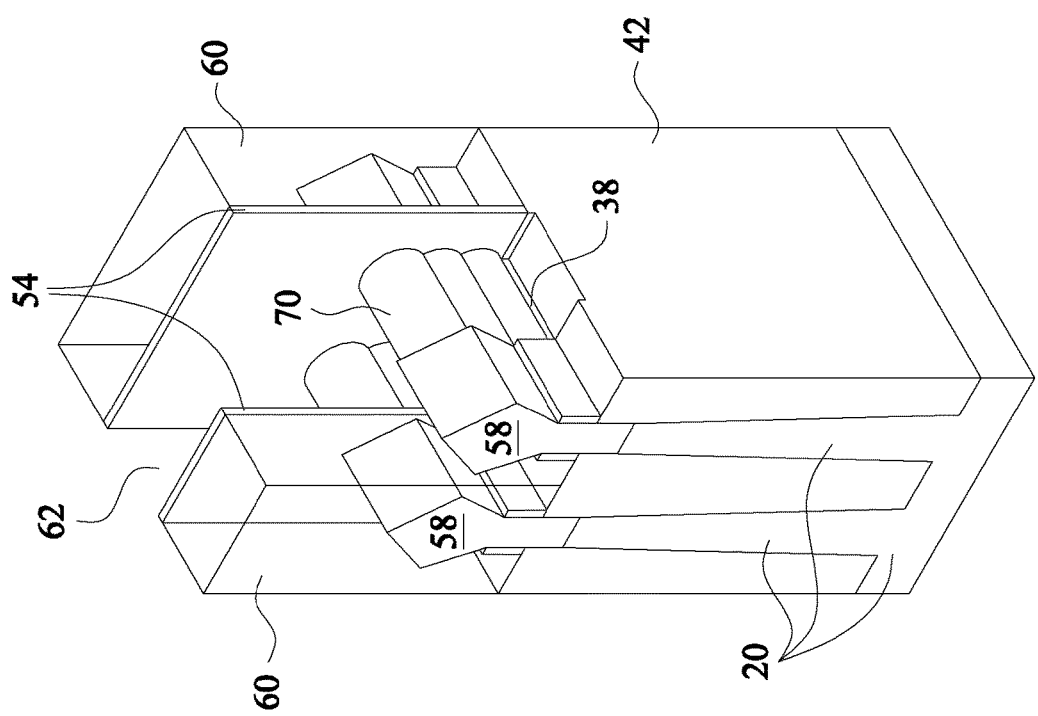
Figure 21B:
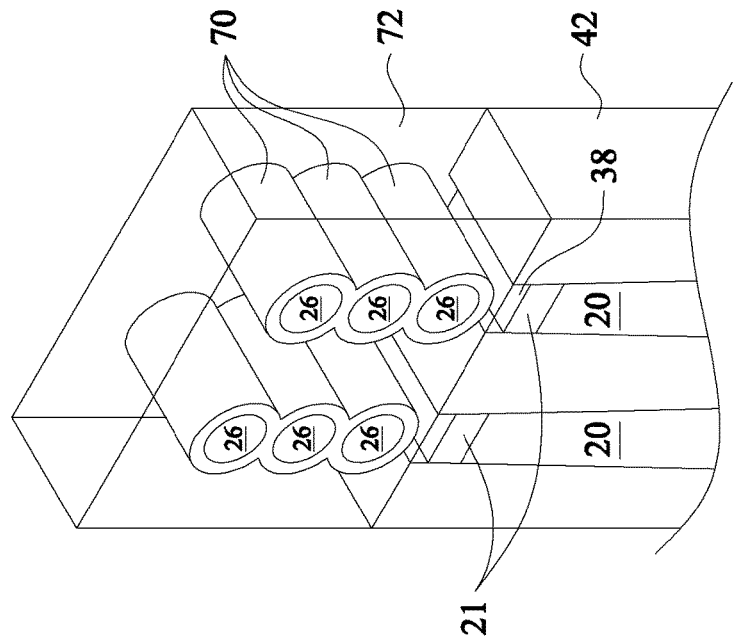
Figure 21A:
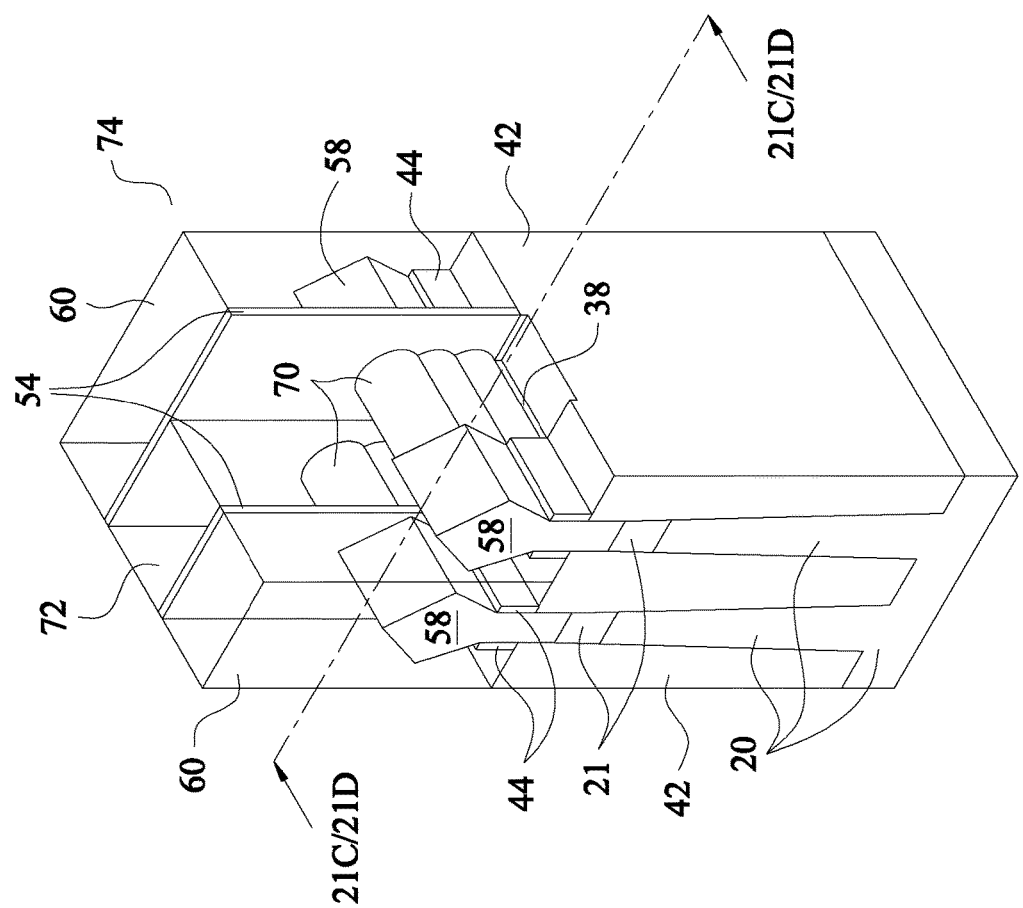

Next, FIGS. 18A and 18B illustrate essentially the same process step and the structure as shown in FIGS. 13A and 13B, respectively, wherein an oxidation is performed, and silicon oxide rings 66 are formed. The bottom ones of silicon oxide rings 66 may be spaced apart from the top surfaces of silicon germanium oxide regions 38 by gaps 64. FIGS. 19A and 19B illustrate essentially the same process step and the structure as shown in FIGS. 14A and 14B, respectively, wherein silicon oxide rings 66 are removed from the core device region. In the meanwhile, the silicon oxide rings 66 in the IO region (not shown) are protected, and are not removed. FIGS. 20A and 20B illustrate essentially the same process step and the structure as shown in FIGS. 15A and 15B, respectively, wherein gate dielectric 70 is formed. FIGS. 21A and 21B illustrate essentially the same process step and the structure as shown in FIG. 16A, wherein gate electrode 72 is formed.

Figure 21C:
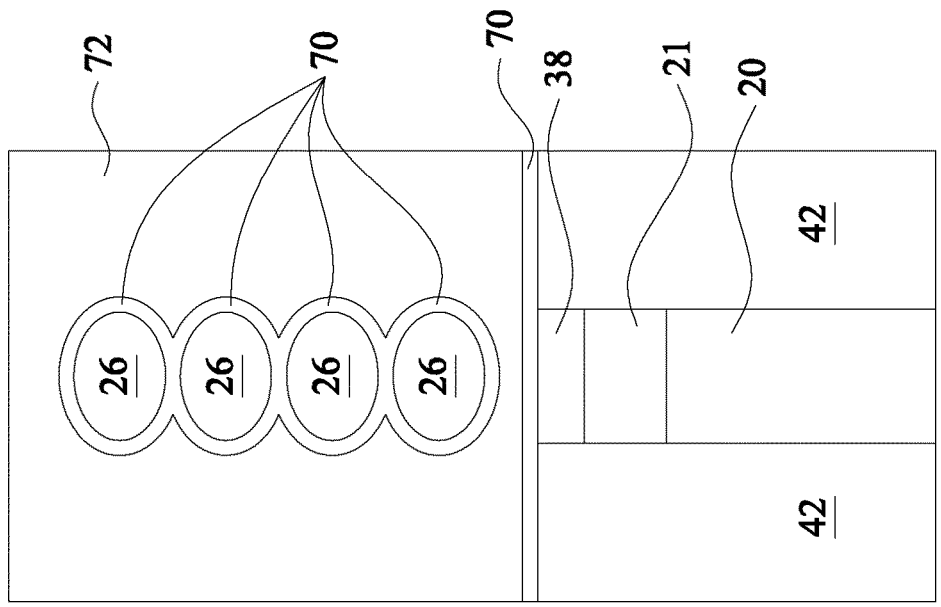
Figure 21D:
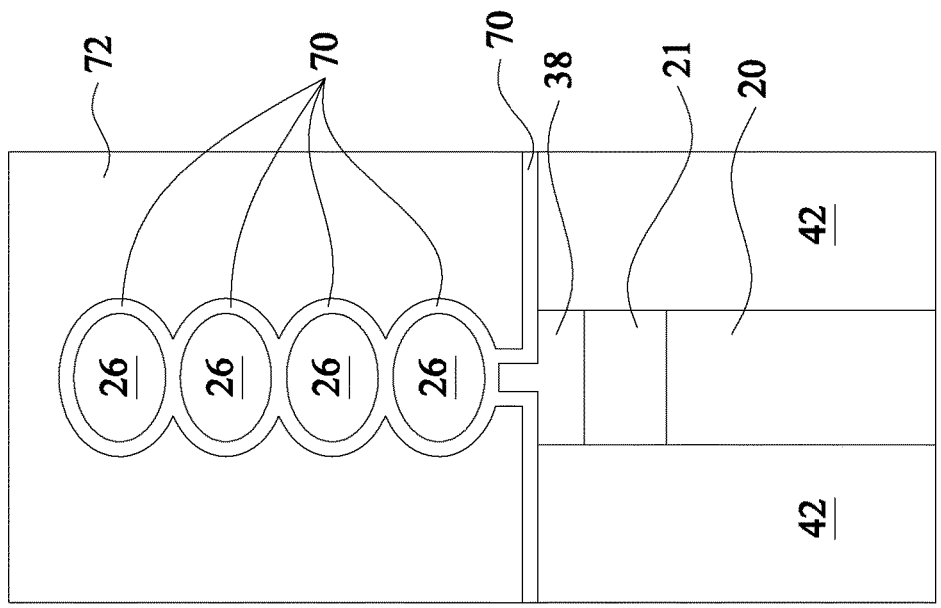
Figure 22:
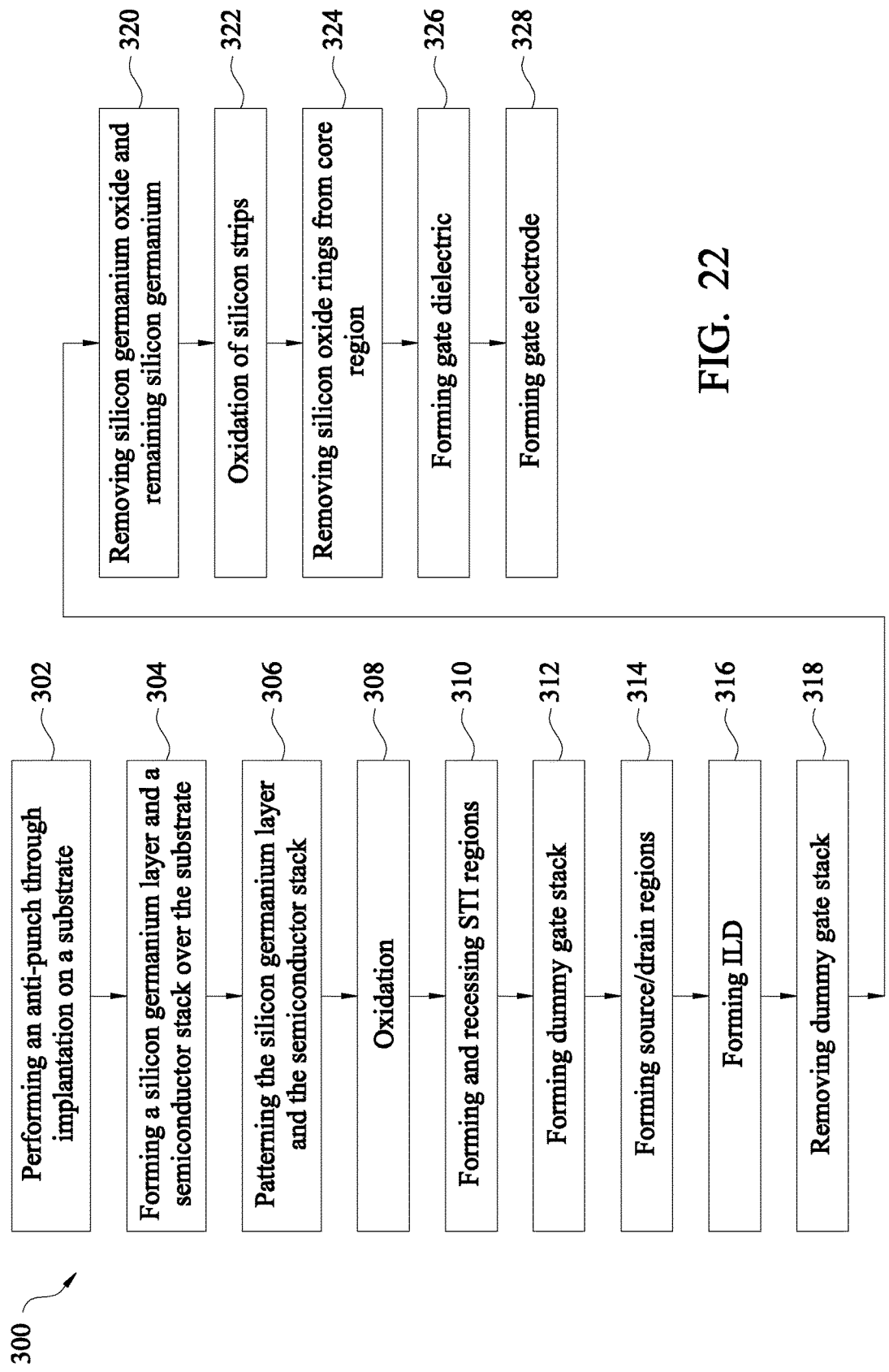
FIG. 22 illustrates a process flow for forming a FinFET in accordance with some embodiments.

FIGS. 21C and 21D illustrate the cross-sectional views of some portions of FinFET 74 in FIG. 21A, wherein the cross-sectional views are obtained from the vertical plane containing line 21C/21D-21C/21D in FIG. 21A. As shown in FIGS. 21C and 21D, gate dielectric 70 fully fills the gap between neighboring silicon strips 26. Accordingly, gate electrode 72 is not filled into the gaps between neighboring silicon strips 26, and will not be shorted to source/drain regions 58 (FIG. 16A).

As a result of the deeper recessing of STI regions 42 and silicon germanium oxide region 38 as shown in FIGS. 17A and 17B, STI regions 42 and silicon germanium oxide regions 38 are spaced farther away from the overlying silicon strips 26. As a result, as shown in FIGS. 21C and 21D, at least some top surfaces of silicon germanium oxide region 38 are spaced apart from the gate dielectric 70 that is formed on the bottom ones of silicon strips 26. In FIG. 21C, the central portion of silicon germanium oxide region 38 is recessed less, and protrudes over the portions of silicon germanium oxide region 38 on the opposite sides of the central portion. Gate dielectric 70 fills the space between the central portion of silicon germanium oxide region 38 and the bottom silicon strip 26. In FIG. 21D, The gate dielectric formed on the bottom silicon strip 26 is separated from a dielectric (also marked as 70) formed on the top surfaces of silicon germanium oxide region 38 and STI regions 42 by a gap, with gate electrode 72 filling the gap.

FIGS. 23A, 23B, and 23C illustrate the cross-sectional views of channels and gates of FinFETs in accordance with alternative embodiments. In these embodiments, there are two, instead of three or four silicon strips 26. Furthermore, semiconductor strips 26 may have heights greater than the respective widths. For example, the height H1 of each of silicon strips 26 may be in the range between about 10 nm and about 30 nm, and the widths W1 of each of silicon strips 26 may be in the range between about 6 nm and about 12 nm. FIGS. 23A, 23B, and 23C illustrate the embodiments corresponding to the embodiments shown in FIGS. 16B/16C, 21C, and 21D, respectively, and hence the details are not repeated herein.

The embodiments of the present disclosure have some advantageous features. The anti-punch-through implantation is performed before the formation of the channel material (silicon strips 26). Accordingly, the channels of the resulting FinFET are not affected by the implanted dopant, and hence the impurity scattering and reduction in carrier mobility suffered from the conventional anti-punch-through implantation is eliminated. The resulting FinFET is a GAA FinFET with a plurality of channels. Accordingly, the short channel effect related to Drain-Induced Barrier Lowering (DIBL) is improved, and the drive current of the FinFET is improved due to the multiple channels.

FIGS. 24 through 40C illustrate cross-sectional views of intermediate stages in the formation of a FinFET in accordance with alternative embodiments. Unless specified otherwise, the materials and the formation methods of the components in these embodiments are essentially the same as the like components, which are denoted by like reference numerals in the embodiments shown in FIGS. 1 through 23C. The details regarding the formation process and the materials of the components shown in FIGS. 24 through 40C may thus be found in the discussion of the embodiments shown in FIGS. 1 through 23C. The steps shown in FIGS. 24 through 40C are also illustrated schematically in the process flow 400 shown in FIG. 41.

Figure 24:
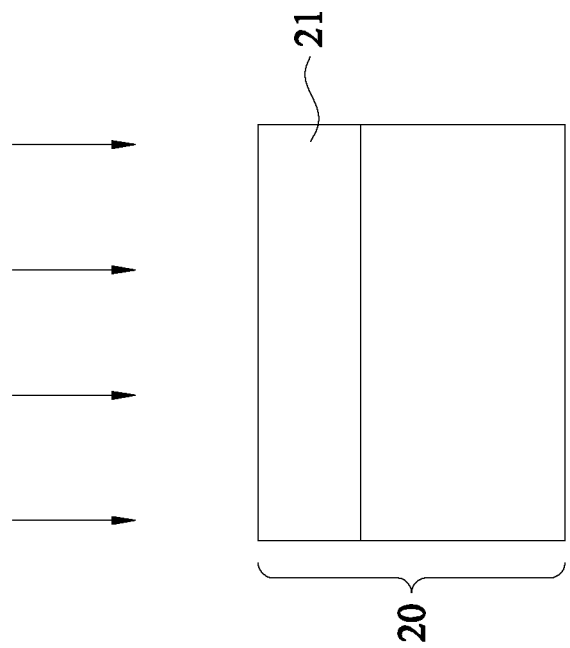

FIG. 24 illustrates the formation of an APT implantation (illustrated by arrows) to form anti-punch-through region 21 in semiconductor substrate 20. The respective step is shown as step 402 in the process flow shown in FIG. 41. The process step and the process detail is essentially the same as shown in FIG. 1, and hence are not repeated herein.

Figure 25:
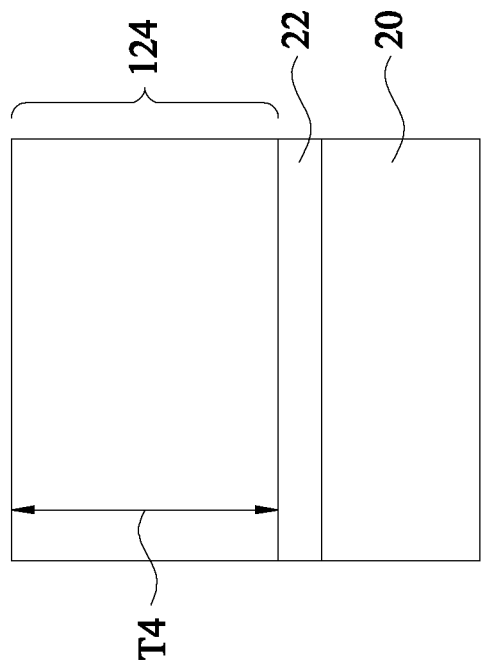

Next, as shown in FIG. 25, SiGe layer 22 and semiconductor layer(s) 124 are formed over substrate 20 through epitaxy. The respective step is shown as step 404 in the process flow shown in FIG. 41. Accordingly, SiGe layer 22 forms a crystalline layer. The germanium percentage (atomic percentage) of SiGe layer 22 is between about 25 percent and about 35 percent, while higher or lower germanium percentages may be used. In accordance with some embodiments of the present disclosure, thickness T4 of SiGe layer 22 is in the range between about 5 nm and about 8 nm.

Semiconductor layer 124 is formed over SiGe layer 22. In accordance with some embodiments of the present application, semiconductor layer 124 is a single layer formed of a homogenous semiconductor material. For example, semiconductor layer 124 may be formed of silicon free from germanium therein. Semiconductor layer 124 may also be a substantially pure silicon layer, for example, with a germanium percentage lower than about 1 percent. Furthermore, semiconductor layer 124 may be intrinsic, which is not doped with p-type and n-type impurities. In accordance with some embodiments, thickness T4 of semiconductor layer 124 is in the range between about 30 nm and about 80 nm.

In accordance with alternative embodiments of the present disclosure, semiconductor layer 124 is a composite layer that is a semiconductor stack having essentially the same structure as semiconductor stack 24 as shown in FIG. 2. Accordingly, the structure and the materials of the composite semiconductor layer 124 may be found in the description of semiconductor stack 24.

In addition, a hard mask (not shown) may be formed over semiconductor layer 124. In accordance with some embodiments, the hard mask is formed of silicon nitride, silicon oxynitride, silicon carbide, silicon carbo-nitride, or the like.

Figure 26:
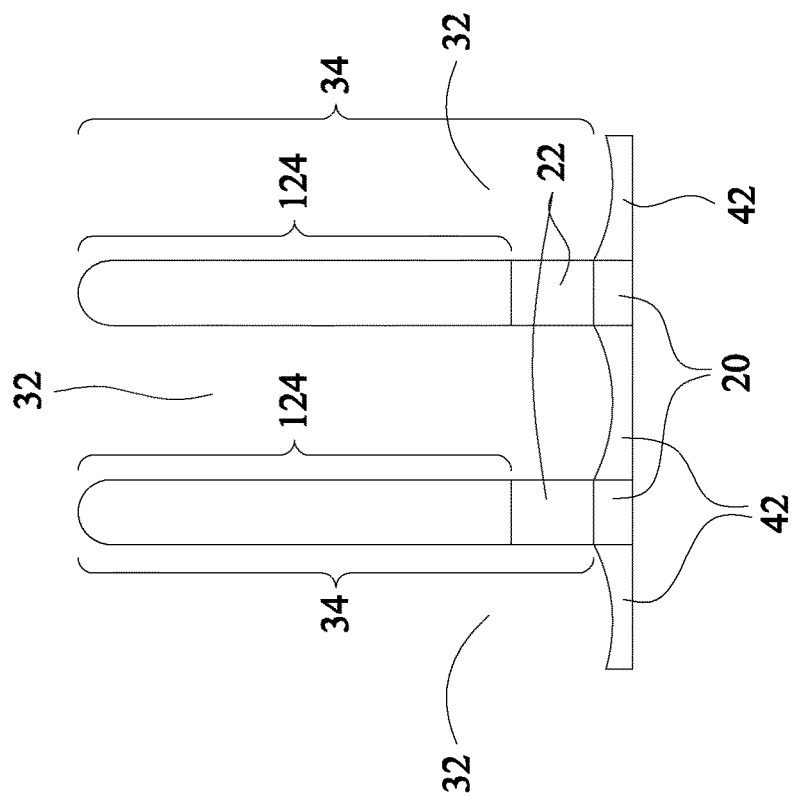

Next, as shown in FIG. 26, the hard mask, semiconductor layer 124, SiGe layer 22 and substrate 20 are patterned to form trenches 32. The respective step is shown as step 406 in the process flow shown in FIG. 41. Accordingly, semiconductor strips 34 are formed. Trenches 32 extends into substrate 20, and trenches 32 and semiconductor strips 34 have lengthwise directions parallel to each other. The remaining portions of semiconductor layer 124 are accordingly referred to as strips alternatively. In a subsequent step, trenches 32 are filled with STI regions 42, followed by the recessing of STI regions 42. In FIG. 26 and subsequent figures, the lower portions of STI regions 42 and substrate 20 are not shown. The portions of the structure below semiconductor layer 22 are essentially the same as the lower parts of the structure shown in FIG. 6, wherein portions of substrate 20 (referred to as a substrate strip hereinafter) are located between opposite portions of STI regions 42.

After the recessing of STI regions 42, the top surfaces of STI regions 42 are lower than the top surfaces of SiGe strips 22. In accordance with some embodiments of the present disclosure, the top surfaces of STI regions 42 are level with or slightly lower than the top surfaces of SiGe strips 22, so that at least some portions, and possibly the entirety, of the sidewalls of SiGe strips 22 are exposed.

Figure 27:
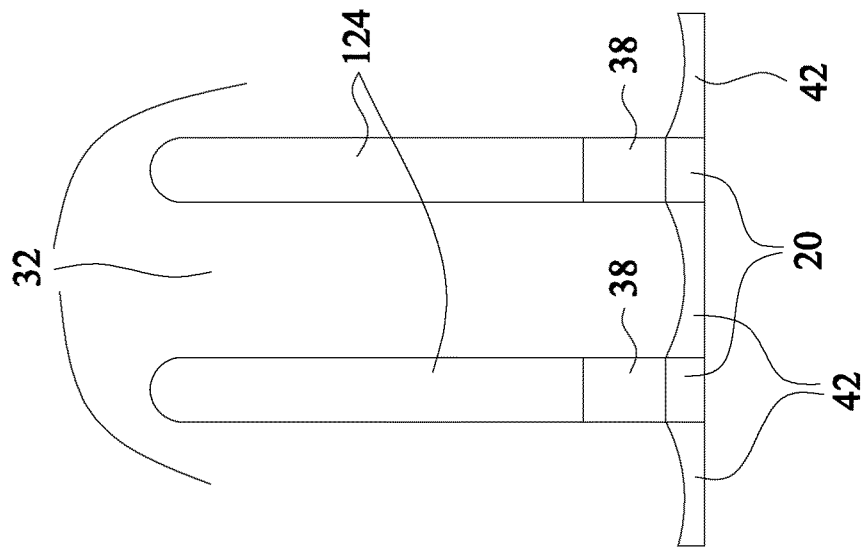

Next, referring to FIG. 27, an oxidation process is performed on the exposed portions of semiconductor strips (fins) 34 to form silicon germanium oxide regions 38. The respective step is shown as step 408 in the process flow shown in FIG. 41. As a result of the oxidation, SiGe layers 22 are fully oxidized to form silicon germanium oxide regions 38. In accordance with some embodiments, the oxidation is performed at a temperature in the range between about 400° C. and 600° C. The oxidation time may range between about 2 minutes and about 4 hours, for example. During the oxidation, silicon oxide (not shown) is also formed on the exposed surfaces of semiconductor strips 124. Due to the much lower oxidation rate of silicon than silicon germanium, the silicon oxide layer on semiconductor strips 124 is thin, and hence is not illustrated herein.

In the embodiments in which semiconductor strips 124 have the same structure as semiconductor strips 24 as shown in FIG. 3, the resulting structure after the oxidation will include silicon germanium oxide regions 40, concentrated silicon germanium regions 28, similar to what is shown in FIG. 4.

Figure 29:
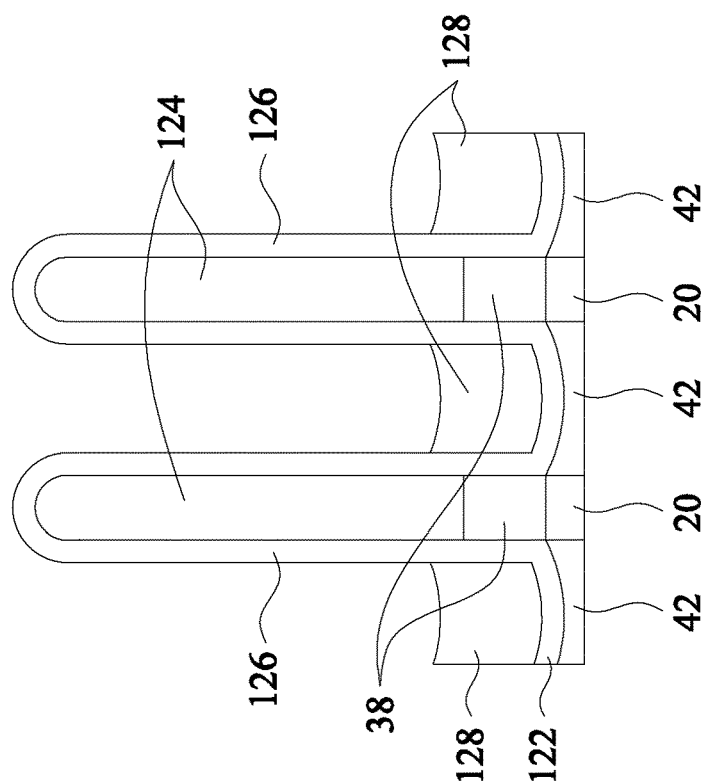
Figure 28:
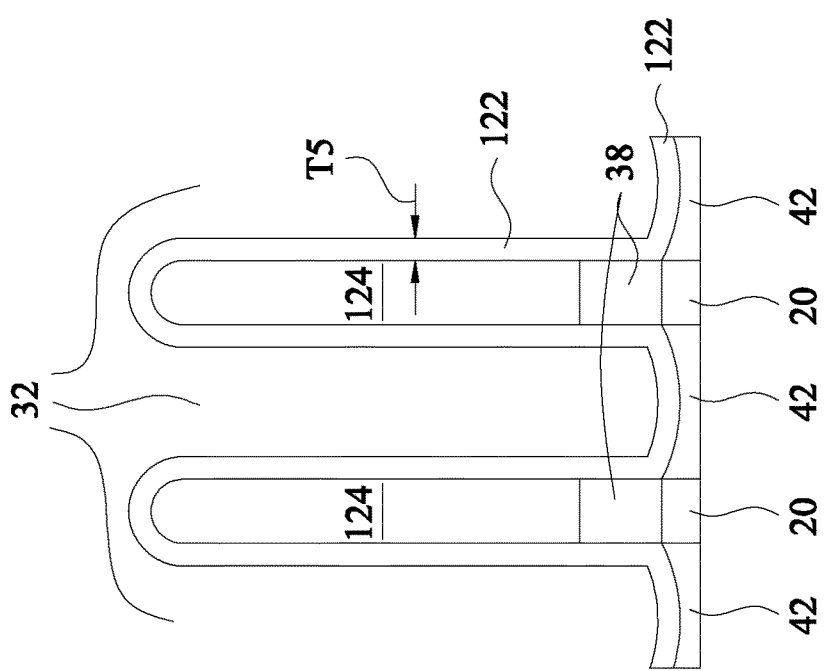
Figure 30:
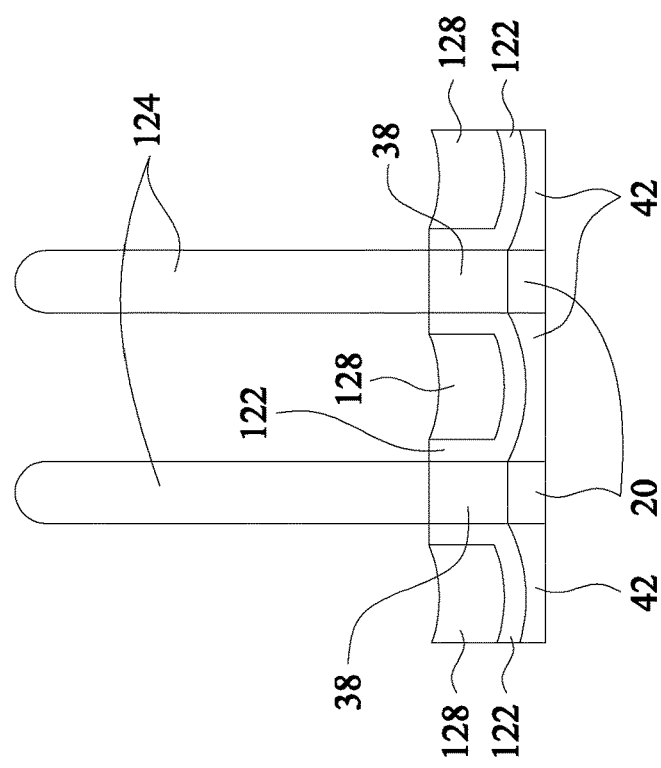

Next, as shown in FIGS. 28 through 30, etch stop layer 122 is formed. The respective step is shown as step 410 in the process flow shown in FIG. 41. Etch stop layer 122 acts as an etch stop layer in the subsequent formation of contact opening for forming source/drain silicides and source/drain contacts. In accordance with some embodiments of the present disclosure, etch stop layer 122 comprises silicon carbo-nitride (SiCN), while other dielectric materials may be used. Etch stop layer 122 may have a thickness in the range between about 3 nm and about 10 nm.

Referring to FIG. 28, etch stop layer 122 is formed as a conformal layer, and hence covers the top surfaces and the sidewalls of semiconductor fins 124 and silicon germanium oxide regions 38. In accordance with some embodiments, thickness T5 of etch stop layer 122 is in the range between about 3 nm and about 10 nm.

Next, as shown in FIG. 29, dielectric regions 128 are formed to fill trenches 32 (FIG. 28), for example, using FCVD. Dielectric regions 128 may comprise silicon oxide in accordance with some embodiments. The top surfaces of the remaining dielectric regions 128 are higher than the top surfaces of silicon germanium oxide regions 38.

FIG. 29 also illustrates the oxidation of the exposed portions of etch stop layer 122, so that the exposed portions of etch stop layer 122 are converted to dielectric layer 126. When etch stop layer 122 is formed of SiCN, the resulting dielectric layer comprises silicon oxycarbo-nitride (SiOCN), which has a different etching characteristic than SiCN. Furthermore, SiOCN is easier to be removed using wet etching than SiCN. Accordingly, the conversion makes is possible to remove the exposed portions of etch stop layer 122 without damaging semiconductor fins 124. In accordance with some embodiments of the present disclosure, the oxidation of etch stop layer 122 is performed using furnace anneal (in an oxygen-containing gas), oxygen implantation, or the like.

After dielectric layer 126 is formed, dielectric layer 126 is removed, for example, through wet etch. The resulting structure is shown in FIG. 30. As a result, semiconductor fins 124 are exposed. The unconverted portions of dielectric etch stop layer 122 remain. In the cross-sectional view, the remaining portions of dielectric etch stop layer 122 have a U-shape (also including L-shapes). In accordance with some embodiments of the present disclosure, the top surfaces of the remaining etch stop layer 122 are level with or higher than the top surfaces of silicon germanium oxide regions 38, so that etch stop layer 122 also protects silicon germanium oxide regions 38 in the subsequent etching for forming contact openings. In the resulting structure, the vertical portions of etch stop layer 122 may have portions coplanar with silicon germanium oxide regions 38. Alternatively, the vertical portions of etch stop layer 122 may be higher than silicon germanium oxide regions 38.

Figure 31:
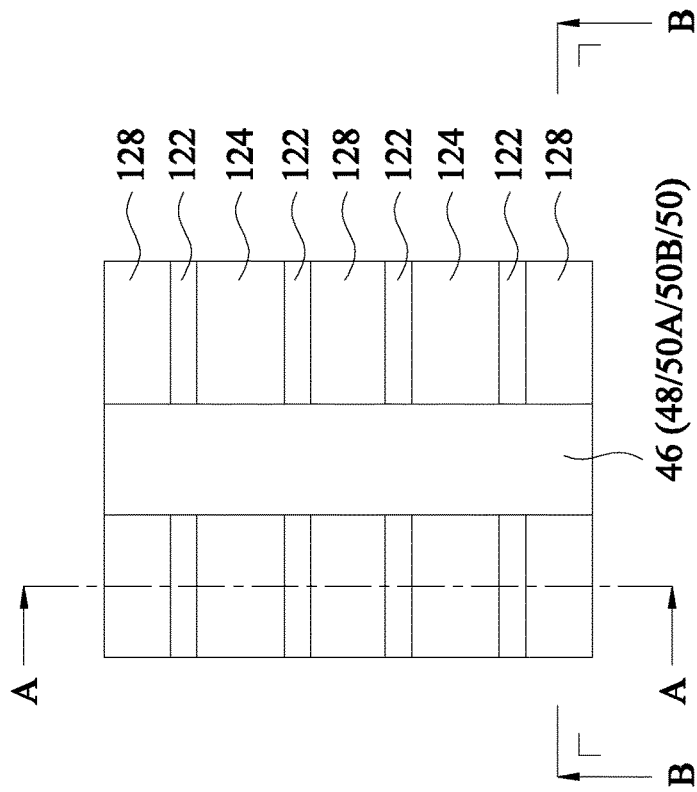

FIG. 31 illustrates a top view showing the formation of dummy gate stack 46, which is formed on the top surfaces and the sidewalls of semiconductor fins 124. The respective step is shown as step 412 in the process flow shown in FIG. 41. The perspective view of dummy gate stack 46 may be essentially the same as shown in FIG. 34B. There may not be gate spacers formed on the sidewalls of dummy gate stack 46 at this time. In accordance with some embodiments, dummy gate stack 46 includes dummy gate electrode 48, which may be formed, for example, using polysilicon. Dummy gate stack 46 may also include hard mask layer 50, which may include, for example, silicon nitride layer 50A and silicon oxide layer 50B over silicon nitride layer 50A. Dummy gate stack 46 has a lengthwise direction substantially perpendicular to the lengthwise direction of semiconductor fins 124, wherein opposite ends of semiconductor fins 124 are not covered by dummy gate stack 46.

FIGS. 32 through 38B illustrate the formation of source and drain regions (referred to as source/drain regions hereinafter). The figure numbers of FIGS. 32 through 38 may be followed by either letter "A" or letter "B," wherein letter "A" indicates that the respective view is obtained from a plane same as the vertical plane containing line A-A in FIG. 31, and letter "B" indicates that the respective figure (except FIG. 34B) is obtained from the plane same as the vertical plane containing line B-B in FIG. 31. Accordingly, the figures whose numbers are followed by letter "A" show the cross-sectional views of source/drain regions, and the figures whose number is followed by letter "B" shows the cross-sectional views of dummy gate stack 46.

Figure 32:
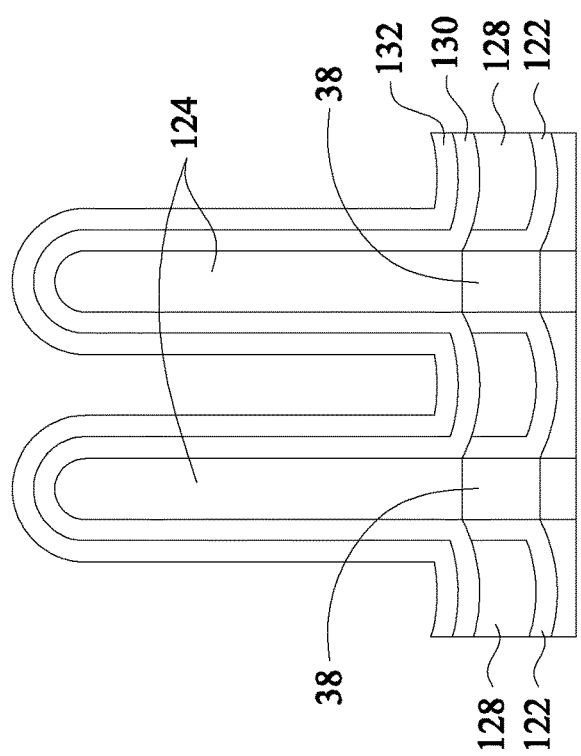

FIGS. 32 through 34B illustrate the formation of source/drain templates for epitaxially growing source/drain regions. The respective step is shown as step 414 in the process flow shown in FIG. 41. Referring to FIG. 32, dielectric layer 130 is formed, followed by the formation of dielectric layer 132 over dielectric layer 130. The materials of dielectric layers 130 and 132 are different from each other. Dielectric layer 132 may be formed of SiOCN in accordance with some embodiments. Dielectric layer 130 is formed of a material different from the material of dielectric layer 132. For example, dielectric layer 130 is formed of silicon oxide in some embodiments. The formation of dielectric layer 130 has the advantageous feature of increasing the widths of the resulting source/drain regions, as will be discussed in subsequent paragraphs. Dielectric layers 130 and 132 are formed as conformal layers, and hence will also extend on the sidewalls (as shown in FIG. 34B) and the top surfaces of dummy gate stack 46.

Figure 33:
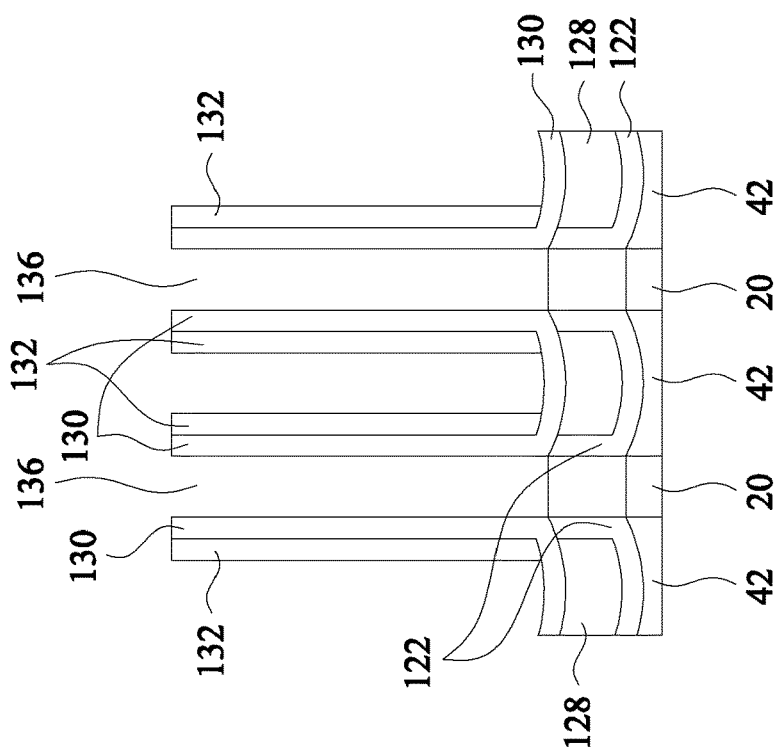

FIG. 33 illustrates the removal of semiconductor fins 124 through etching, wherein the removed portions are not covered by dummy gate stack 46 (FIG. 31). The portions of dielectric layers 130 and 132 over semiconductor fins 124 are also removed in the etching. After the etching of semiconductor fins 124, silicon germanium oxide regions 38 (FIG. 32) are also etched. Source/drain recesses 136 are thus formed to extend to portions of substrate 20 that are between STI regions 42. Recesses 136 have substantially vertical sidewalls, which sidewalls include the sidewalls of dielectric layer 130 and etch stop layer 122. In accordance with some embodiments, the etching is anisotropic.

Figure 34A:
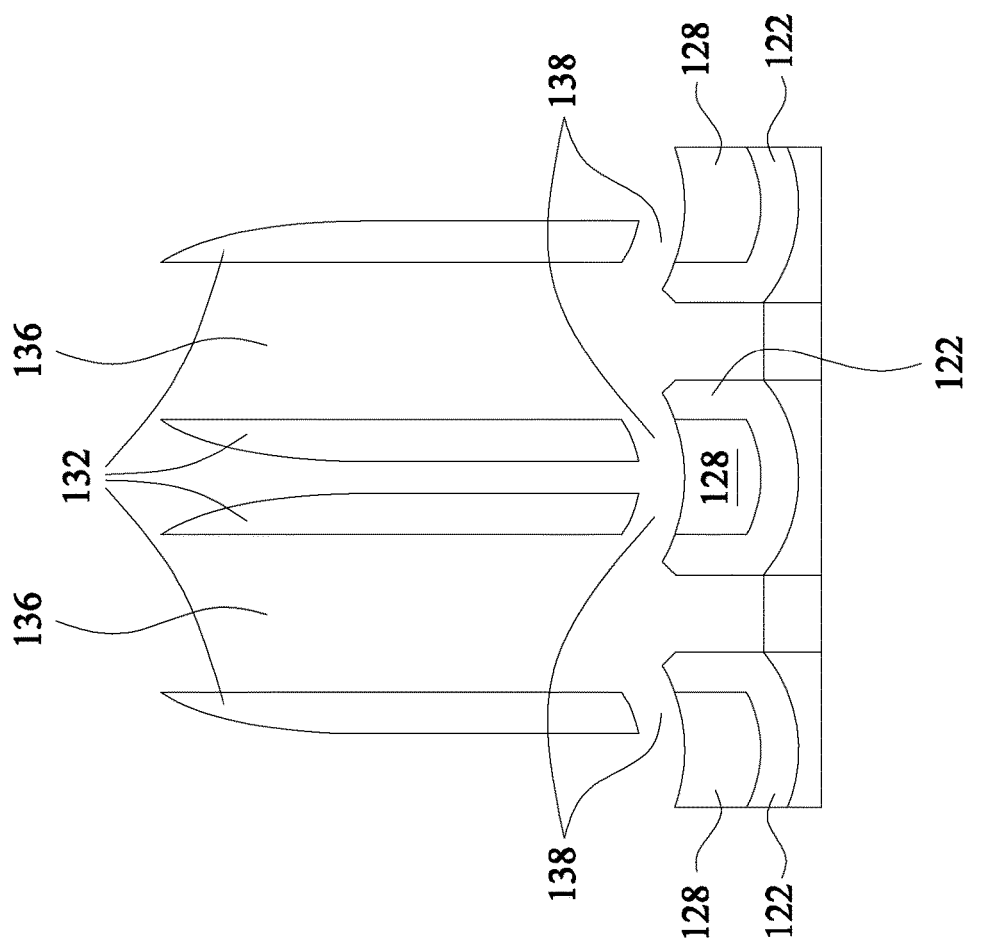
Figure 34B:
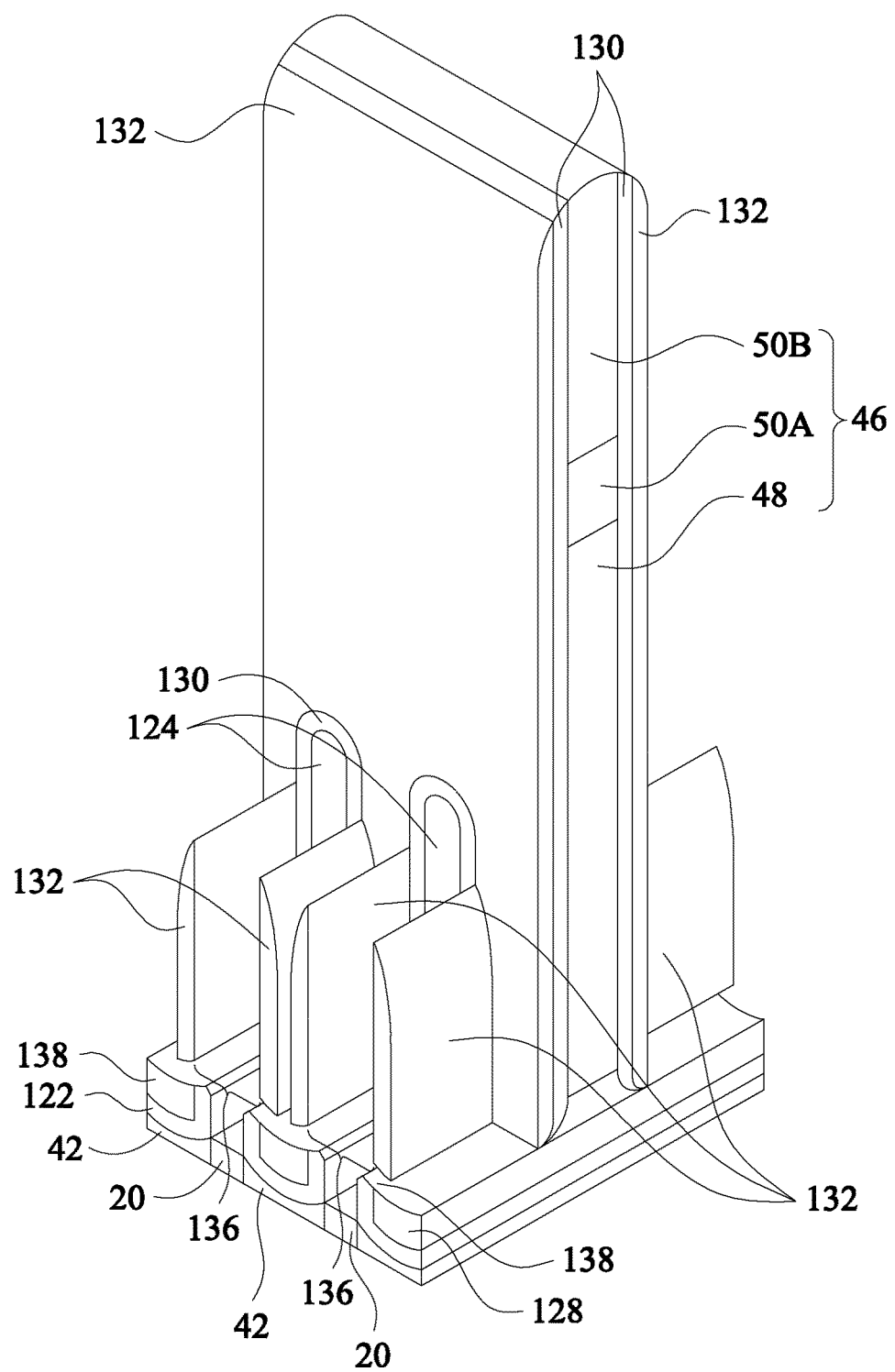

Next, an etching step is performed to remove dielectric layer 130, and the resulting structure is shown in FIGS. 34A and 34B, which illustrate a cross-sectional view of the source/drain regions and a perspective view of the source/drain areas and the dummy gate stack 46, respectively. The etching may be isotropic using, for example, wet etching. As a result, the lateral widths of recesses 136 are increased over that in FIG. 33. This may advantageously increase the widths of source/drain regions subsequently grown in recesses 136. Furthermore, the bottom surfaces of the remaining portions of dielectric layer 132 (referred to as dielectric templates 132 hereinafter) are spaced apart from the underlying dielectric regions 128 by gaps 138. Accordingly, dielectric templates 132 are suspended.

As shown in FIG. 34B, which is a perspective view, dielectric templates 132 are connected to the portions of dielectric layer 132 on the sidewalls of dummy gate stack 46, and hence will not fall off. Also, the portions of dielectric layer 130 on the sidewalls of dummy gate stack 46 may remain, and are exposed to recesses 136.

In a subsequent step, source/drain regions are epitaxially grown in recesses 136 as shown in FIGS. 34A and 34B. The respective step is shown as step 416 in the process flow shown in FIG. 41. With the existence of gaps 138 (FIG.

Figure 35:
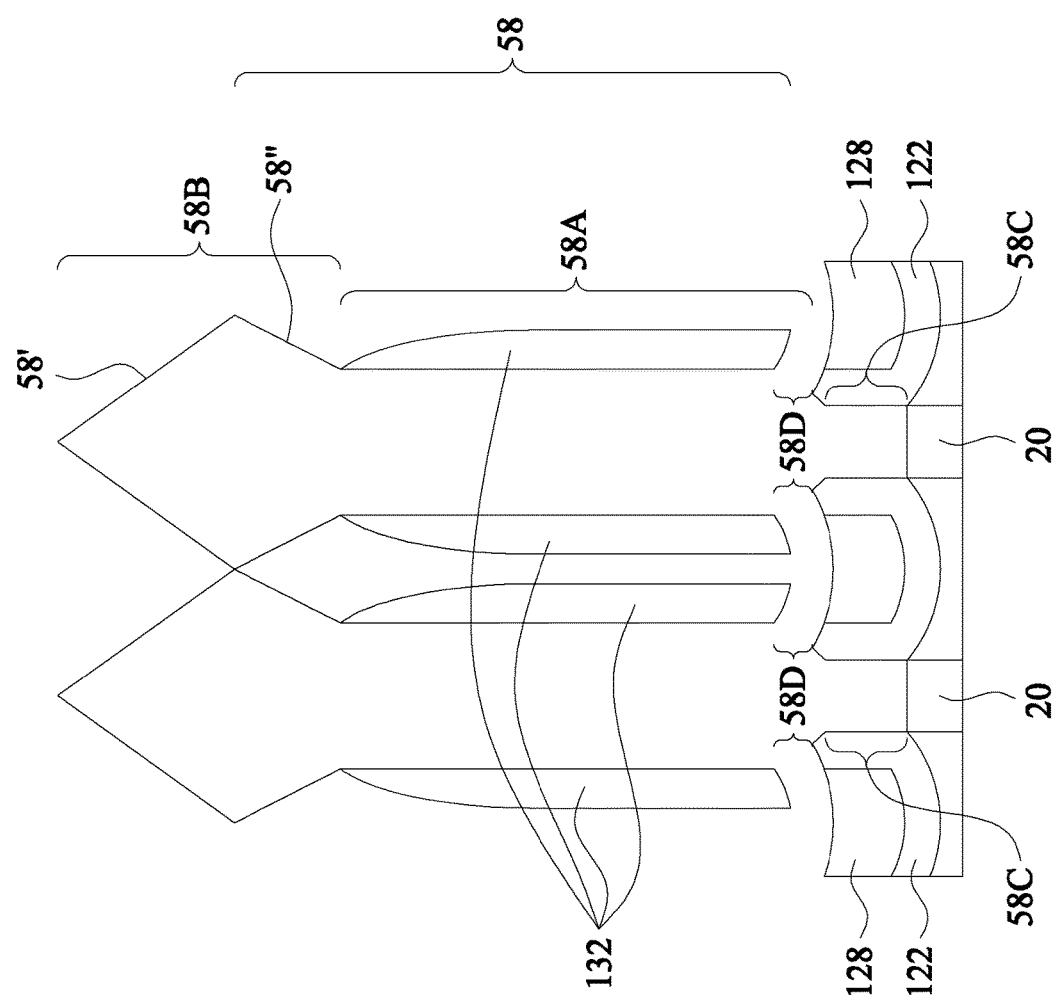

34B), it is easy for precursors to reach the bottoms and the inner parts of recesses 136, and hence it is less likely the resulting source/drain regions will have voids. FIG. 35 illustrates the resulting source/drain region 58. The materials and the formation process of source/drain region 58 are similar to what are shown in FIG. 10, and hence are not repeated herein. Source/drain regions 58 include portions 58A having vertical sidewalls, portions 58B having facets 58' and 58", portions 58C between etch stop layers 122, and portions 58D formed in gaps 138 (FIG. 34A).

Figure 36A:
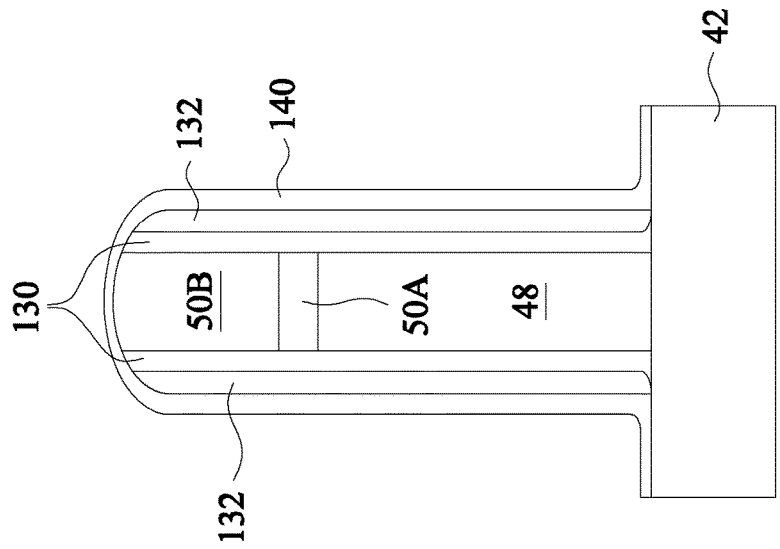
Figure 36B:
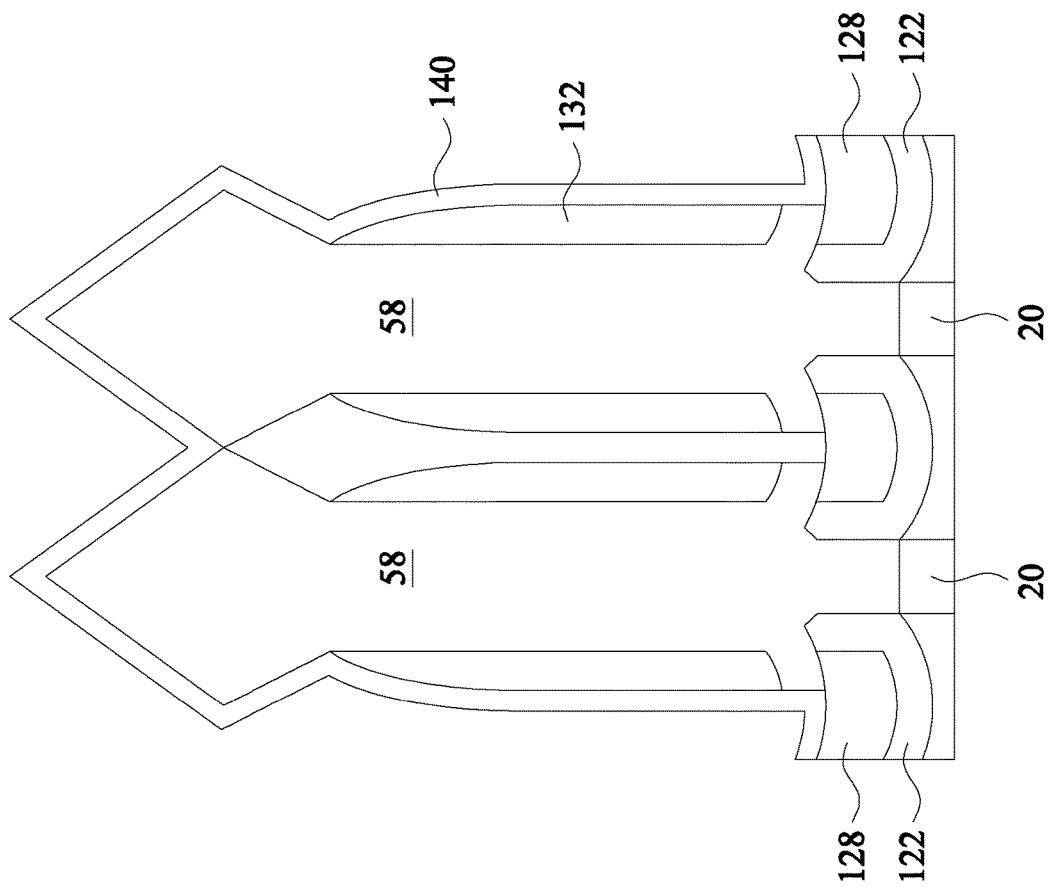

FIGS. 36A through 37B illustrate the trimming of source/drain regions 58, so that the facets 58' and 58" in FIG. 35 are removed to form vertical source/drain regions 58. The respective step is shown as step 418 in the process flow shown in FIG. 41. Referring to FIG. 36A, dielectric layer 140 is formed. In accordance with some embodiments, dielectric layer 140 is formed of a same material as that of dielectric layer 132, which may include, for example, SiOCN. As shown in FIG. 36B, which shows dummy gate stack 46, dielectric layer 140 is also formed on dummy gate stack 46 and contacting dielectric layer 132.

Figure 37A:
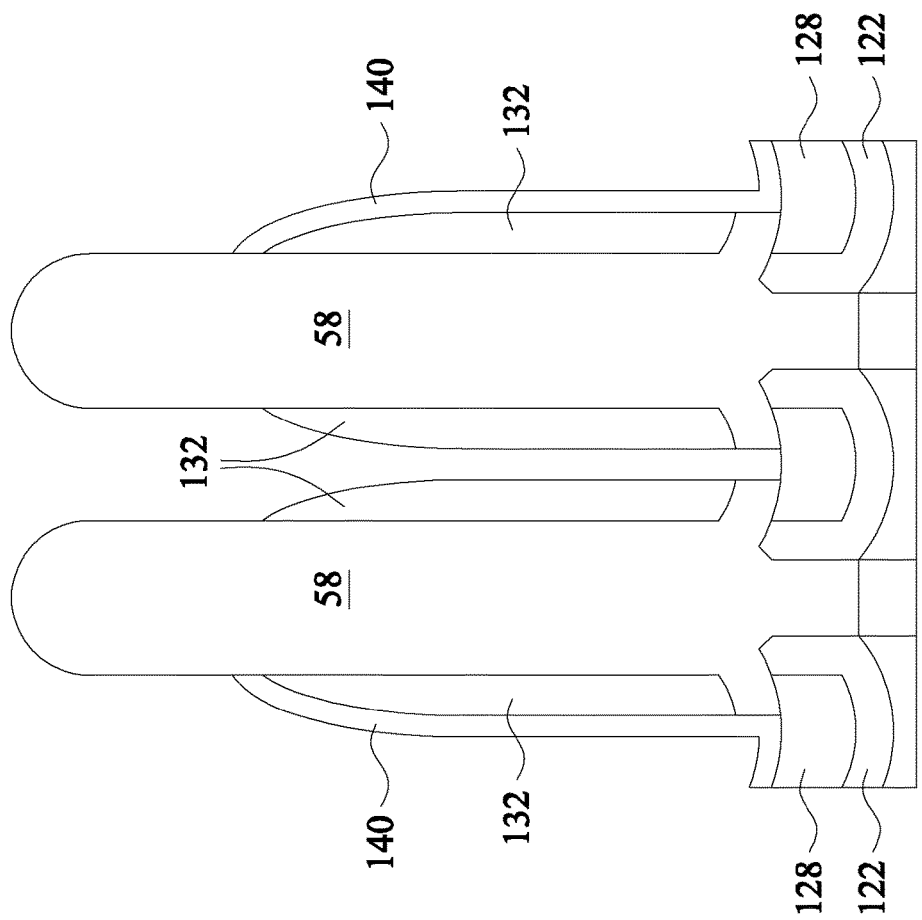
Figure 37B:
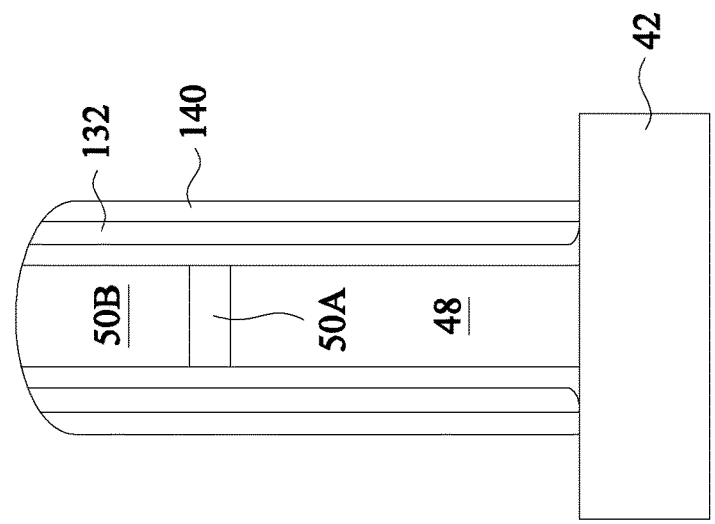

Next, as shown in FIGS. 37A and 37B, a dry etch is performed to etch the portions of dielectric layer 140 overlapping source/drain regions 58, so that source/drain regions 58 are exposed. A trimming step is then performed, for example, using anisotropic (dry) etching, and the facets of source/drain regions 58 are removed. The resulting structures are shown in FIGS. 38A and 38B, which illustrate the source/drain portions and the dummy gate stack, respectively. As a result of the source/drain trimming, the resulting source/drain regions 58 have substantially vertical sidewalls, with no substantial facets remaining. The sidewalls of the exposed source/drain regions 58 are substantially vertical and straight. Next, a dry etching is performed to remove the portions of dielectric layers 132 and 140 on the sidewalls of source/drain regions 58. Etch stop layer 122 is hence exposed. In the meanwhile, the top surface of dummy gate stack 46 is also exposed, as shown in FIG. 38B. The remaining portions of dielectric layers 132 and 140 form gate spacers 132/140. It is appreciated that dielectric layers 132 and 140 may have distinguishable interfaces since they are formed in different process steps, regardless of whether they are formed of the same or different materials. The formation of dielectric layer 140 advantageously increases the thickness of gate spacers, so that in the structure in FIG. 38B, the top ends of gate spacers 132/140 are higher than the top surface of polysilicon layer 48. In the resulting structure, the thickness of gate spacers 132/140 may be in the range between about 3 nm and about 10 nm.

Figure 40A:
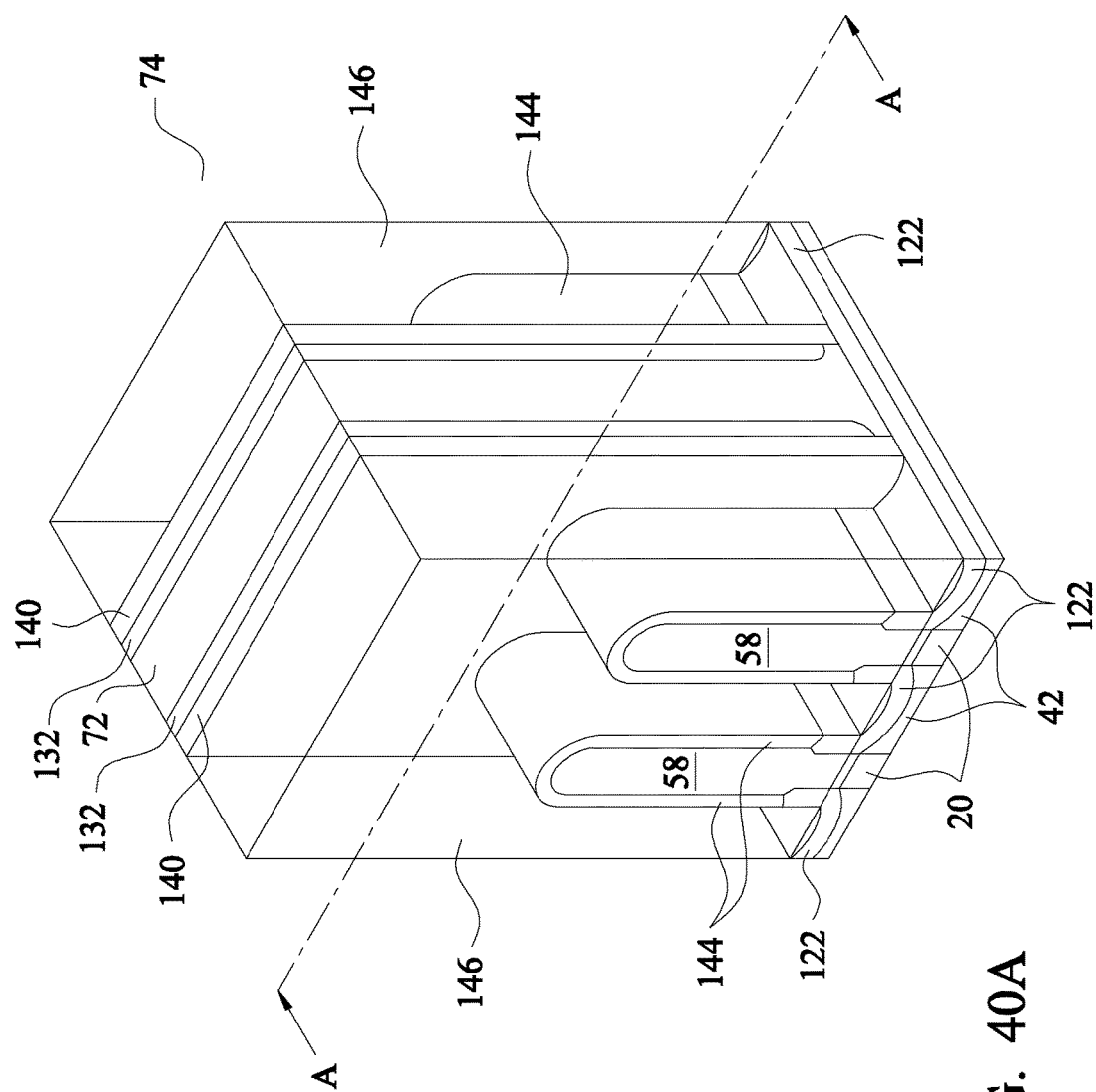
Figure 41:
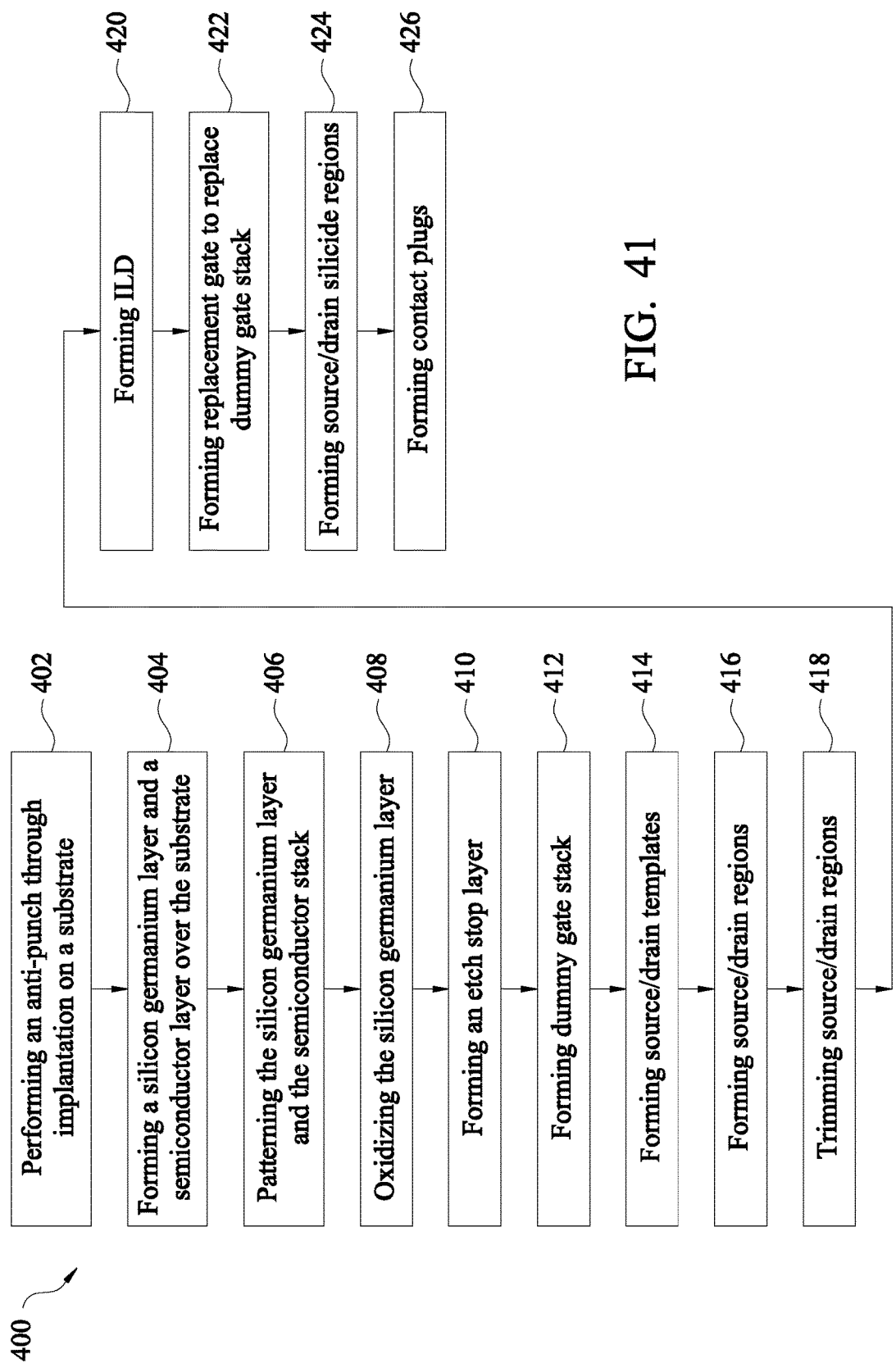
FIG. 41 illustrates a process flow for forming a FinFET in accordance with some embodiments.

Next, as shown in FIGS. 39A and 39B, ILD 60 is formed. The respective step is shown as step 420 in the process flow shown in FIG. 41. A CMP may then be performed to level the top surfaces of ILD 60, top surface of dummy gate stack 46, and gate spacers 132/140 with each other. In subsequent steps, dummy gate stack 46 (FIG. 39B) is removed, and a gate dielectric (not shown) and gate electrode 72 are formed as a replacement gate, as shown in FIG. 40A. The respective step is shown as step 422 in the process flow shown in FIG. 41. In the embodiments in which semiconductor fins 124 (FIG. 34B) are formed of a homogeneous material, the formation of the replacement gate includes forming an interfacial dielectric layer and a high-k dielectric layer on the sidewalls and the top surfaces of semiconductor fins 124 (FIG. 34B), forming a conductive material over the high-k dielectric layer, and performing a CMP to level the top surfaces of the interfacial dielectric layer, the high-k dielectric layer, and the conductive material with the top surface of ILD 60. In alternative embodiments wherein semiconductor fins 124 have the same structure as semiconductor stack 24 as shown in FIG. 2, the steps shown in FIGS. 11 through 16B may be performed to form the replacement gate.

Referring again to FIG. 40A, after the formation of the replacement gate, ILD 60 is etched to form contact opening (occupied by contact plugs 142 as in FIGS. 40A and 40B), wherein source/drain regions 58 are exposed to the contact openings. In the etching of ILD 60, etch stop layer 122 acts as the etch stop layer for protecting the underlying STI regions 42. The top ends of etch stop layer 122 may be higher than the top ends of silicon germanium oxide regions 38 by height difference ΔH, which may be in the range between about 2 nm and about 5 nm, so that silicon germanium oxide regions 38 are adequately protected from the etching either. In accordance with some embodiments of the present disclosure, as shown in FIG. 40A, a majority of etch stop layer 122 is higher than silicon germanium oxide regions 38. In alternative embodiments, as shown in FIG. 30, etch stop layer 122 and silicon germanium oxide regions 38 have most portions level with each other.

Next, a silicidation process is performed to form source/drain silicide regions 144 on the sidewalls of source/drain regions 58, followed by filling the remaining contact openings with a conductive material to form source/drain contact plugs 146. The respective steps are shown as steps 424 and 426 in the process flow shown in FIG. 41. In accordance with some embodiments of the present disclosure, the silicide regions comprise nickel silicide, titanium silicide, cobalt silicide, or the like. Contact plugs 146 may include cobalt, tungsten, or the like. FinFET 74 is thus formed, as shown in FIG. 40A.

Figure 40B:
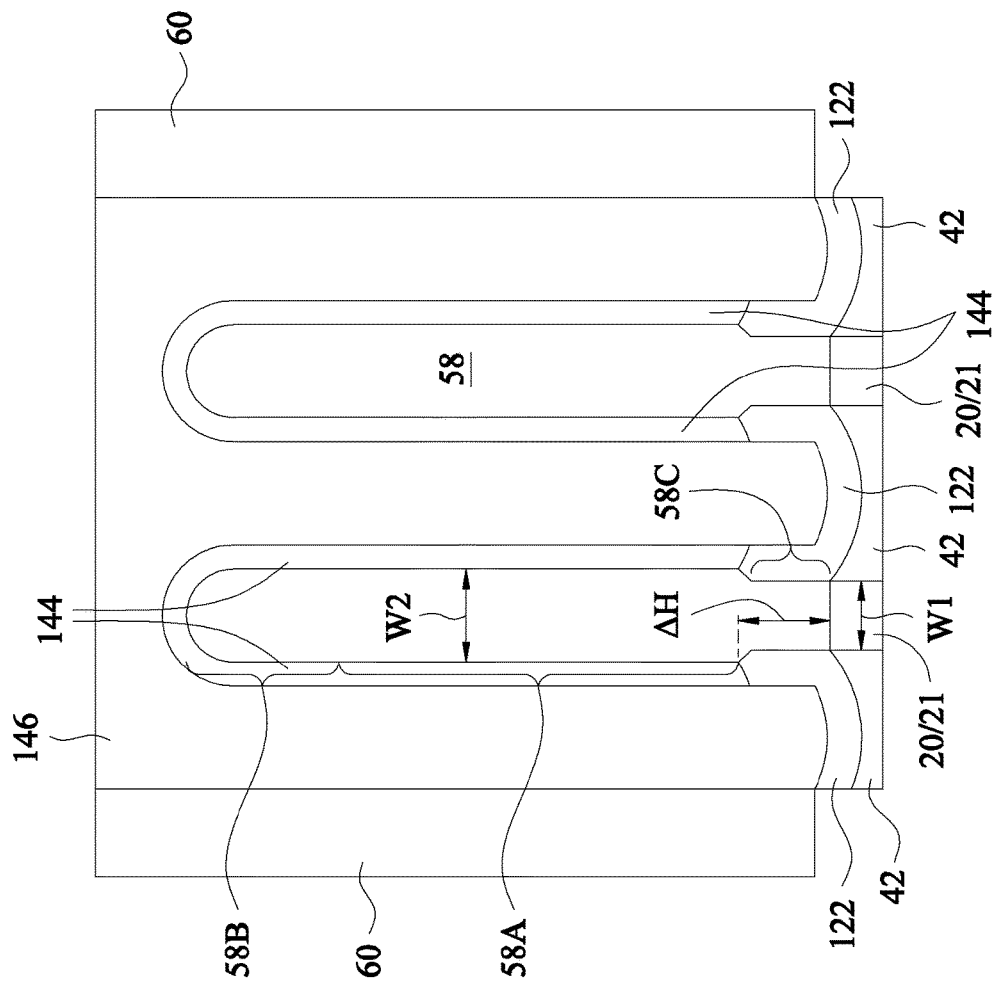
Figure 40C:
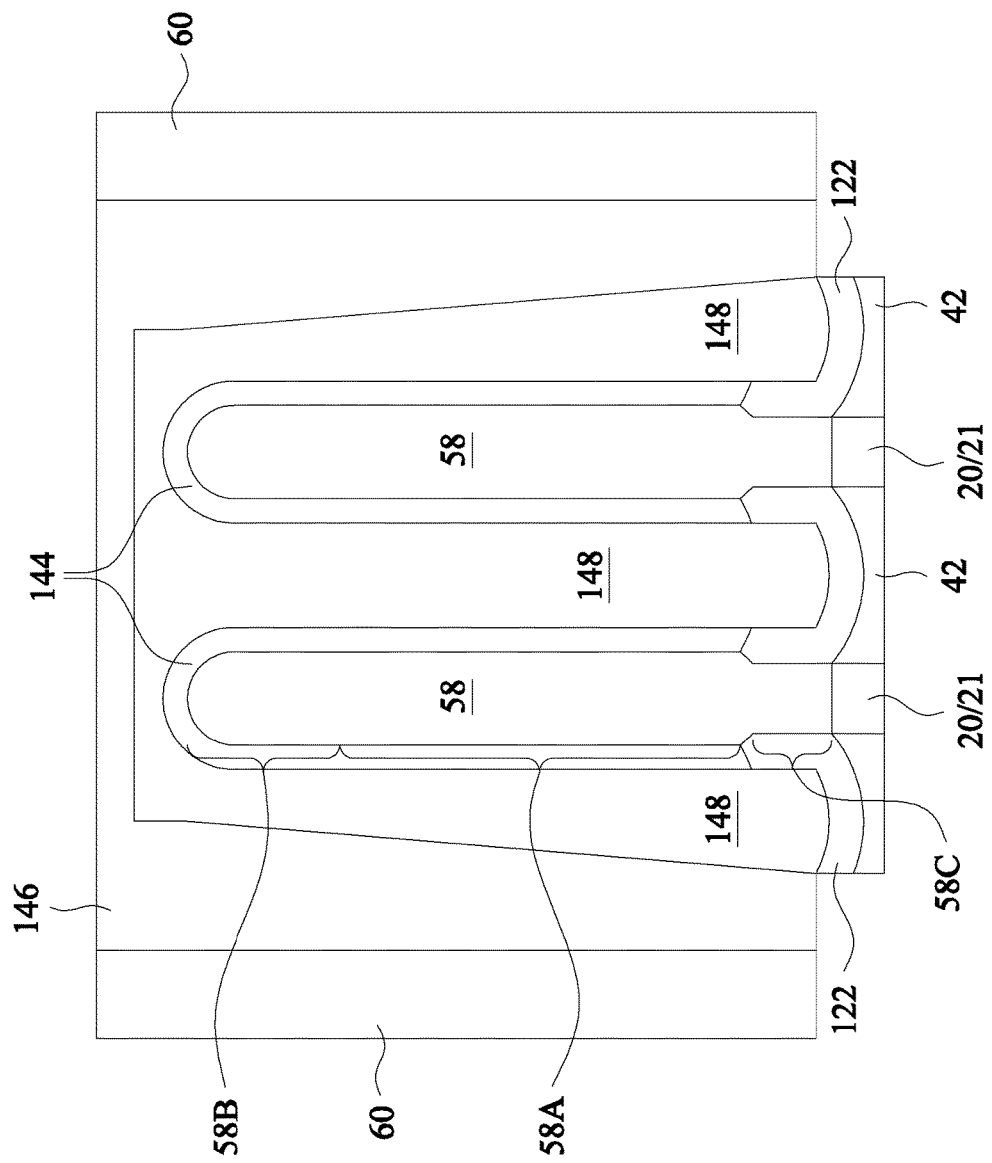

FIGS. 40B and 40C illustrate the cross-sectional views of the source/drain portions of FinFET 74 in accordance with various embodiments, wherein the cross-sectional views are obtained from the plane A-A in FIG. 40A. In FIG. 40B, after the silicidation process, the remaining metal used for forming metal silicide is removed, and hence contact plugs 146 are in contact with silicide regions 144. In FIG. 40C, the remaining metal 148 used for forming metal silicide is not removed, with metal 148 including nickel, titanium, cobalt, or the like.

The embodiments of the present disclosure have some advantageous features. As shown in FIG. 40B, neighboring STI regions 42 have distance W1, which is the width of the strip portion of substrate 20 between STI regions 42. Source/drain regions 58 have lower portions 58C with width W1. Source/drain regions 58 further have upper portions 58A/58B with width W2, which is greater than width W1. For example, width W1 may be in the range between about 2 nm and about 6 nm, and width W2 may be in the range between about 6 nm and about 12 nm. The width difference (W2−W1) is caused by the formation and the removal of dielectric layer 130 (FIG. 32). Accordingly, the width of source/drain regions is advantageously greater than the width of the underlying substrate portion. In addition, by forming dielectric templates, forming source/drain regions from the templates, and then trimming the source/drain regions, the resulting source/drain regions may have a great height while still have vertical sidewalls. Therefore, silicide regions may be formed on tall and vertical sidewalls of the source/drain regions, and hence the source/drain contact resistance is reduced, resulting in increased saturation currents for the resulting FinFET.

In accordance with some embodiments of the present disclosure, a device includes a first semiconductor strip, a first gate dielectric encircling the first semiconductor strip, a second semiconductor strip overlapping the first semiconductor strip, and a second gate dielectric encircling the second semiconductor strip. The first gate dielectric contacts the first gate dielectric. A gate electrode has a portion over the second semiconductor strip, and additional portions on opposite sides of the first and the second semiconductor strips and the first and the second gate dielectrics.

In accordance with alternative embodiments of the present disclosure, a device includes a substrate, a first and a second STI region extending into the substrate, a silicon germanium oxide layer between the first and the second STI regions, and a plurality of semiconductor strips stacked to overlap the silicon germanium oxide layer. A gate dielectric encircles each of the plurality of semiconductor strips, with some portions of the gate dielectric encircling the plurality of semiconductor strips being joined together to form a continuous region. A gate electrode is on the gate dielectric. Source and drain regions connect to opposite ends of the plurality of semiconductor strips.

In accordance with yet alternative embodiments of the present disclosure, a method includes forming a semiconductor stack, which includes a first plurality of semiconductor layers and a second plurality of semiconductor layers laid out with an alternating layout. The semiconductor stack is patterned to form a stack of semiconductor strips. The second plurality of semiconductor layers in the stack of semiconductor strips is removed, with the first plurality of semiconductor layers in the stack of semiconductor strip remaining as semiconductor strips. The semiconductor strips are oxidized to form dielectric rings encircling remaining portions of the semiconductor strips. Gate dielectrics are formed on the semiconductor strips, wherein the gate dielectrics formed on neighboring ones of the semiconductor strips are in contact with each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first semiconductor strip;
   a first gate dielectric encircling the first semiconductor strip;
   a second semiconductor strip overlapping the first semiconductor strip;
   a second gate dielectric encircling the second semiconductor strip, wherein the first gate dielectric contacts the second gate dielectric, wherein each of the first gate dielectric and the second gate dielectric comprises:
      a silicon oxide layer encircling the respective one of the first and the second semiconductor strips, and the silicon oxide layer encircling the first semiconductor strip is in contact with the silicon oxide layer encircling the second semiconductor strip; and
      a high-k dielectric layer comprising portions on opposite sides of, and contacting, the silicon oxide layer; and
   a gate electrode comprising a first portion over the second semiconductor strip, and portions on opposite sides of the first and the second semiconductor strips and the first gate dielectric and the second gate dielectric.

2. The device of claim 1 further comprising:
   a first shallow trench isolation region and a second shallow trench isolation region; and
   a silicon germanium oxide layer between the first and the second shallow trench isolation regions, wherein the first and the second semiconductor strips overlap a middle portion of the silicon germanium oxide layer.

3. The device of claim 1, wherein a portion of the gate electrode is overlapped by a portion of the second semiconductor strip, and overlaps a portion of the first semiconductor strip.

4. The device of claim 2, wherein the silicon germanium oxide layer has a first top surface, and a second and a third top surface on opposite sides of the first top surface, with the second and the third top surfaces being lower than the first top surface.

5. The device of claim 2, wherein the silicon germanium oxide layer is separated from the first gate dielectric by a portion of the gate electrode.

6. The device of claim 1 further comprising a source/drain region connected to both the first semiconductor strip and the second semiconductor strip.

7. A device comprising:
   a substrate;
   a first Shallow Trench Isolation (STI) region and a second STI region extending into the substrate;
   a silicon germanium oxide layer between the first and the second STI regions, wherein sidewalls of the silicon germanium oxide layer are in contact with sidewalls of the first and the second STI regions;
   a plurality of semiconductor strips stacked to overlap the silicon germanium oxide layer;
   a gate dielectric encircling each of the plurality of semiconductor strips, wherein portions of the gate dielectric encircling the plurality of semiconductor strips are joined together to form a continuous region, wherein the gate dielectric comprises an extension portion having a bottom surface in contact with a top surface of the silicon germanium oxide layer;
   a gate electrode on the gate dielectric, wherein a portion of the gate electrode overlaps a portion of a first one of the plurality of semiconductor strips, and is overlapped by a portion of a second one of the plurality of semiconductor strips; and
   source and drain regions connected to opposite ends of the plurality of semiconductor strips.

8. The device of claim 7, wherein a first gate dielectric encircling a first one of the plurality of semiconductor strips and a second gate dielectric encircling a second one of the plurality of semiconductor strips are continuously connected to each other with no distinguishable interface therebetween.

9. The device of claim 7, wherein the silicon germanium oxide layer comprises:
   a lower portion lower than top surfaces of the first and the second STI regions; and
   an upper portion overlying the lower portion, wherein the gate dielectric extends down to contact opposite sidewalls of the upper portion of the silicon germanium oxide layer.

10. The device of claim 7, wherein the plurality of semiconductor strips is intrinsic.

11. The device of claim 7, wherein the silicon germanium oxide layer is spaced apart from the gate dielectric by a portion of the gate electrode.

12. A device comprising:
a semiconductor substrate;
a first semiconductor strip over the semiconductor substrate;
a first gate dielectric encircling the first semiconductor strip;
a second semiconductor strip overlapping the first semiconductor strip;
a second gate dielectric encircling the second semiconductor strip, wherein the first gate dielectric contacts the second gate dielectric, wherein each of the first gate dielectric and the second gate dielectric comprises:
 a silicon oxide layer encircling the respective one of the first and the second semiconductor strips, wherein the silicon oxide layer of the first gate dielectric contacts the silicon oxide layer of the second gate dielectric; and
 a high-k dielectric layer comprising portions on opposite sides of, and contacting, the silicon oxide layer, wherein the portions of the high-k dielectric layer are overlapped by the second semiconductor strip;
a gate electrode comprising a first portion over the second semiconductor strip, and portions on opposite sides of the first and the second semiconductor strips and the first gate dielectric and the second gate dielectric; and
a silicon germanium oxide layer underlying and in contact with the first gate dielectric, wherein the first gate dielectric comprises an extension portion contacting a top surface of the silicon germanium oxide layer.

13. The device of claim 12, wherein the first gate dielectric and the second gate dielectric are continuously connected to each other with no distinguishable interface therebetween.

14. The device of claim 12 further comprising:
a first isolation region and a second isolation region extending into the semiconductor substrate, wherein the silicon germanium oxide layer is between, and contacting sidewalls of, the first isolation region and the second isolation region.

15. The device of claim 12, wherein the first and the second semiconductor strips are directly over a middle portion of the silicon germanium oxide layer.

16. The device of claim 12, wherein the silicon oxide layer of the first gate dielectric and the silicon oxide layer of the second gate dielectric share a middle portion aligned to a straight line interconnecting centers of the first and the second semiconductor strips, and the high-k dielectric layer of the first gate dielectric and the high-k dielectric layer of the second gate dielectric share a first portion and a second portion overlapping the first semiconductor strip, and the first portion and the second portion are separated from each other by the middle portion.

17. The device of claim 12, wherein the gate electrode comprises:
a first portion overlapped by a first portion of the second semiconductor strip, and overlaps a first portion of the first semiconductor strip; and
a second portion overlapped by a second portion of the second semiconductor strip, and overlaps a second portion of the first semiconductor strip, wherein the first portion and the second portion of the gate electrode are separated from each other by a common gate dielectric region comprising a portion of the first gate dielectric and a portion of the second gate dielectric.

18. The device of claim 2, wherein the first gate dielectric comprises a portion having a bottom surface contacting a top surface of the silicon germanium oxide layer.

19. The device of claim 9, wherein the gate dielectric further contacts a top surface of the lower portion of the silicon germanium oxide layer.

20. The device of claim 12, wherein the silicon oxide layer of the first gate dielectric is in contact with the silicon oxide layer of the second gate dielectric.

* * * * *